(12) United States Patent
Oda et al.

(10) Patent No.: US 8,952,720 B2
(45) Date of Patent: Feb. 10, 2015

(54) RECONFIGURABLE INTEGRATED CIRCUIT DEVICE AND WRITING METHOD THEREOF

(71) Applicant: Kabushiki Kaisha Toshiba, Tokyo (JP)

(72) Inventors: Masato Oda, Kanagawa (JP); Shinichi Yasuda, Tokyo (JP); Koichiro Zaitsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 13/774,668

(22) Filed: Feb. 22, 2013

(65) Prior Publication Data

US 2014/0035616 A1    Feb. 6, 2014

(30) Foreign Application Priority Data

Jul. 31, 2012    (JP) ................. 2012-169742

(51) Int. Cl.
*H03K 19/173*    (2006.01)
*G11C 16/02*    (2006.01)
*H03K 19/00*    (2006.01)
*H03K 19/177*    (2006.01)

(52) U.S. Cl.
CPC ...... *H03K 19/0008* (2013.01); *H03K 19/17748* (2013.01)
USPC ............ 326/38; 326/40; 326/41; 365/185.01; 365/185.05; 365/158

(58) Field of Classification Search
USPC ................. 326/38–41; 365/185.01, 185.05, 365/185.07, 185.08, 158
See application file for complete search history.

(56) References Cited

U.S. PATENT DOCUMENTS

| | | | | |
|---|---|---|---|---|
| 5,982,661 A | * | 11/1999 | Kawamata | 365/185.01 |
| 6,002,610 A | * | 12/1999 | Cong et al. | 365/185.05 |
| 6,356,478 B1 | * | 3/2002 | McCollum | 365/185.01 |
| 6,446,159 B2 | * | 9/2002 | Kai et al. | 711/106 |
| 6,972,986 B2 | | 12/2005 | Peng et al. | |
| 7,129,749 B1 | | 10/2006 | Fenstermaker et al. | |
| 7,430,137 B2 | * | 9/2008 | Greene et al. | 365/185.05 |
| 7,764,081 B1 | | 7/2010 | Tuan et al. | |
| 7,929,345 B2 | * | 4/2011 | Issaq | 365/185.05 |
| 8,432,186 B1 | * | 4/2013 | Zaitsu et al. | 326/38 |
| 8,629,690 B2 | * | 1/2014 | Matsumoto et al. | 326/38 |

* cited by examiner

*Primary Examiner* — Vibol Tan
(74) *Attorney, Agent, or Firm* — Patterson & Sheridan, LLP

(57) ABSTRACT

A reconfigurable integrated circuit device includes a memory unit for storing configuration information. The memory unit has a nonvolatile memory transistor having a gate connected to a first wire, a first terminal connected to a second wire, and a second terminal connected to a third wire. The memory unit also includes a switch circuit connected to the third wire. The switch circuit alters the configuration of the integrated circuit device by, for example, opening and closing to make wiring connections or disconnections. The integrated circuit device additionally includes a data supply circuit for supplying bit data and a first power supply circuit for supplying voltages to the first wire for storing bit data in the first nonvolatile memory transistor and for storing bit data as a charge level on the third wire.

20 Claims, 56 Drawing Sheets

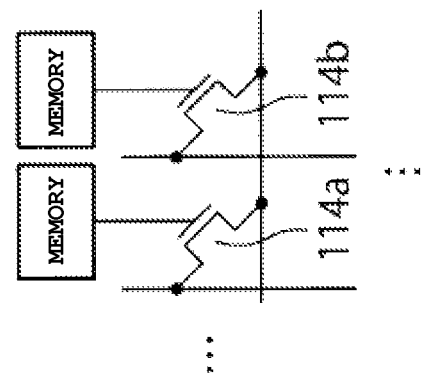

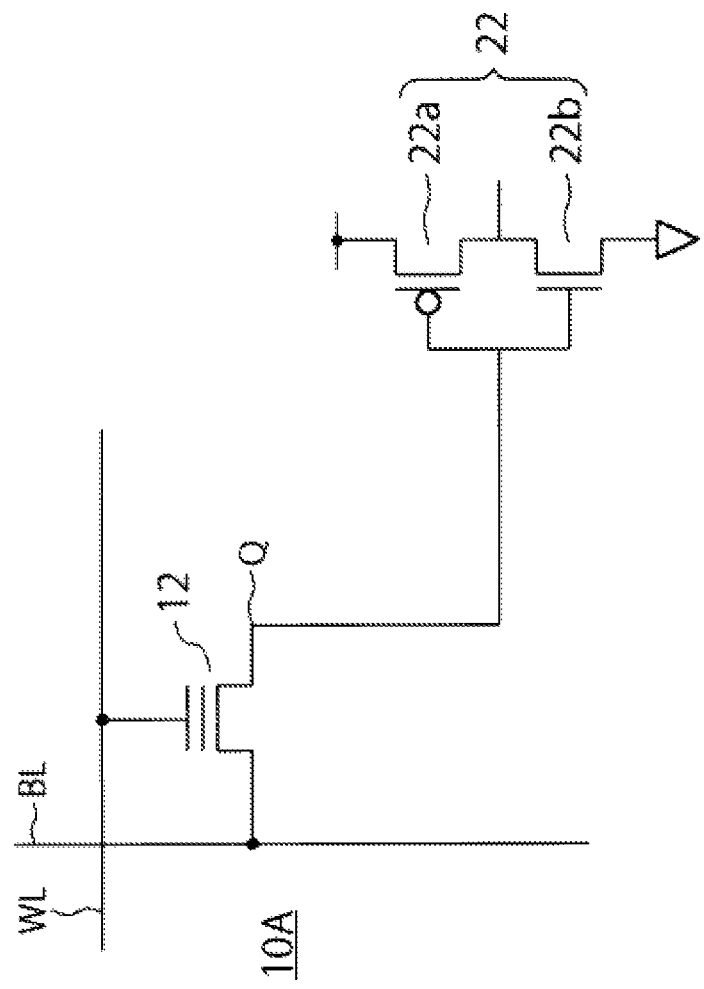

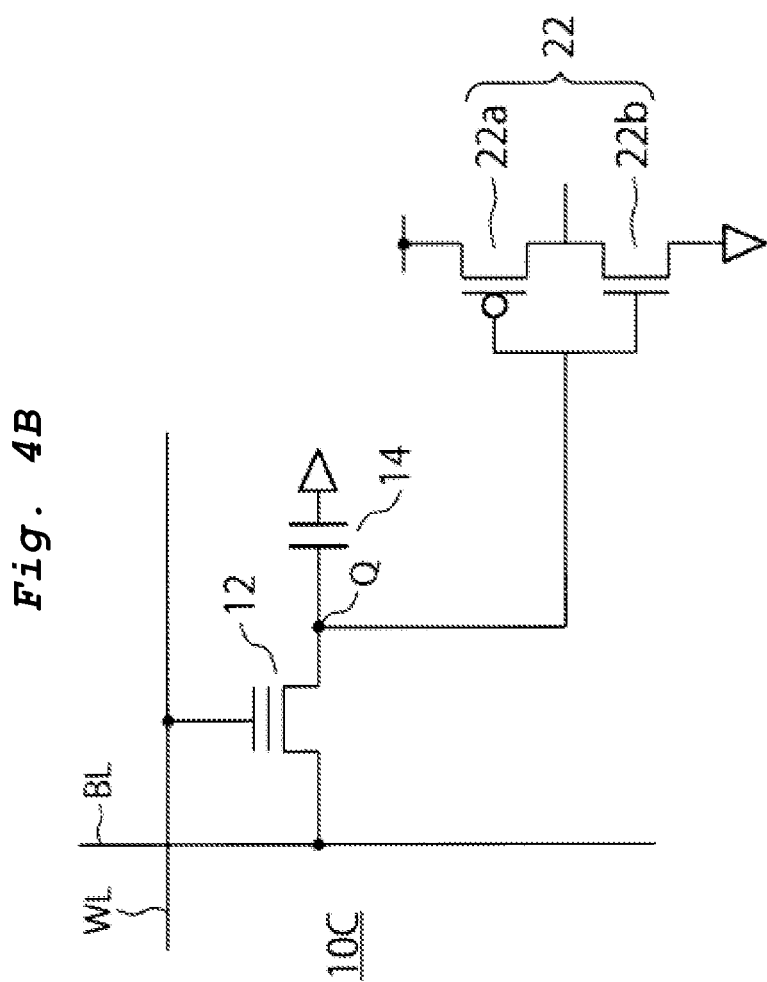

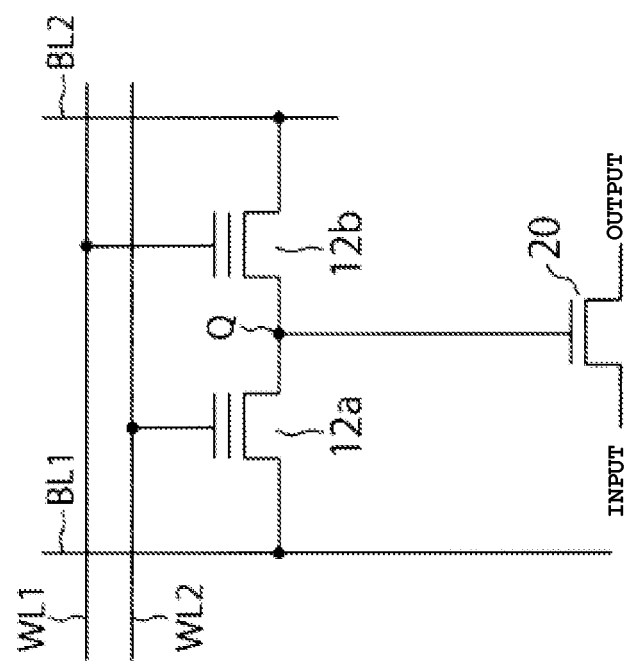

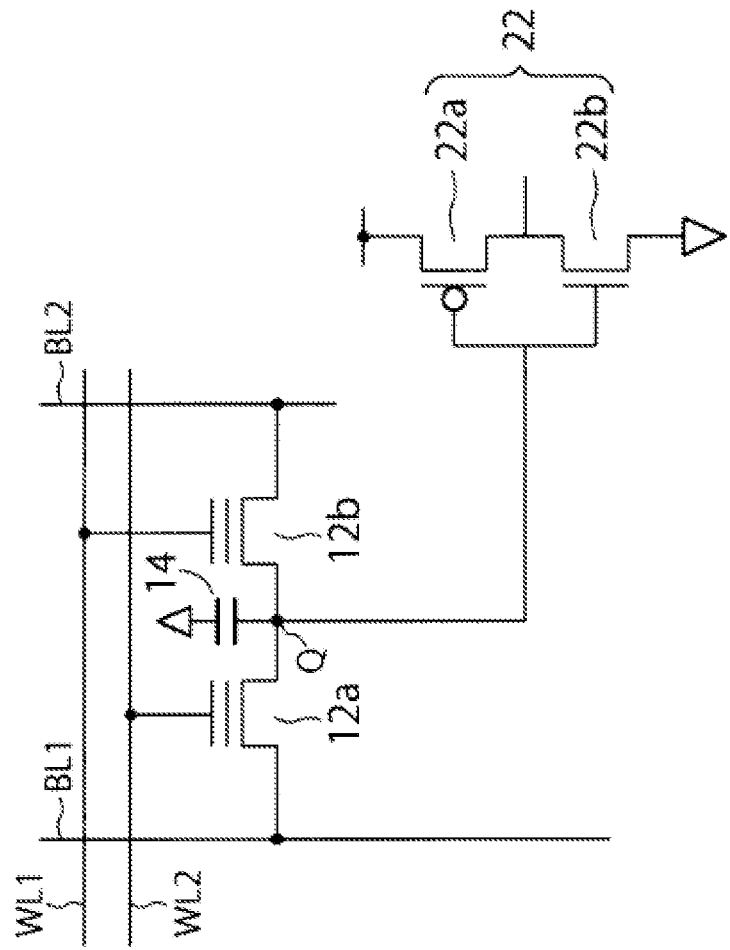

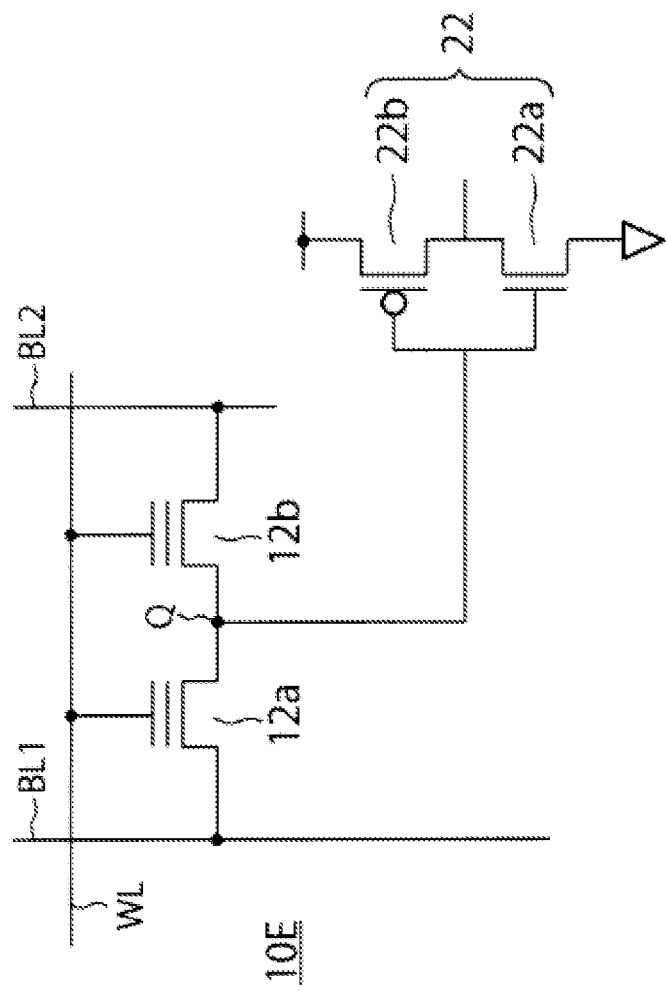

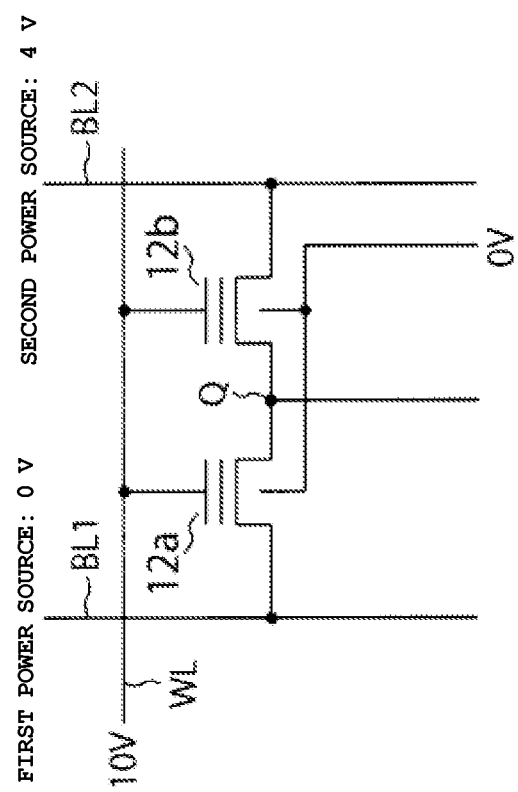

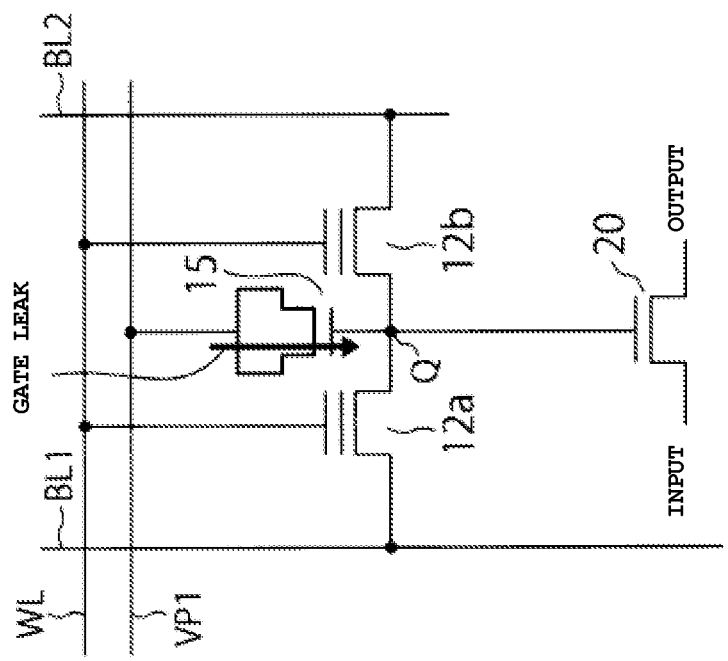

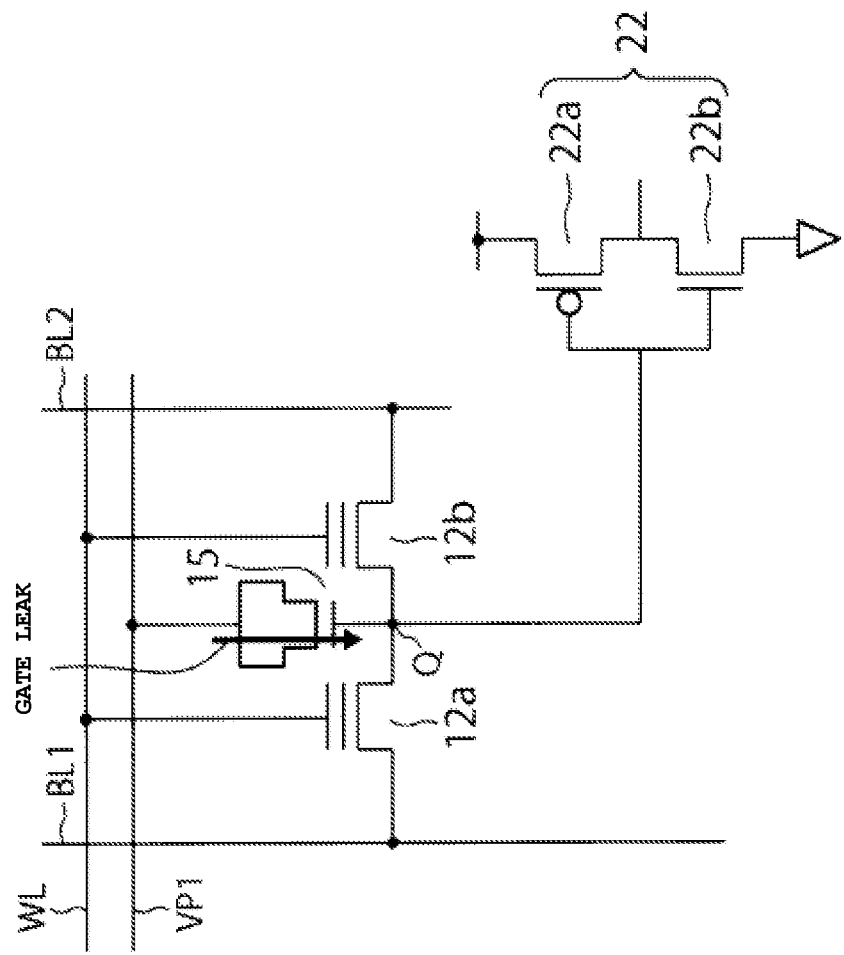

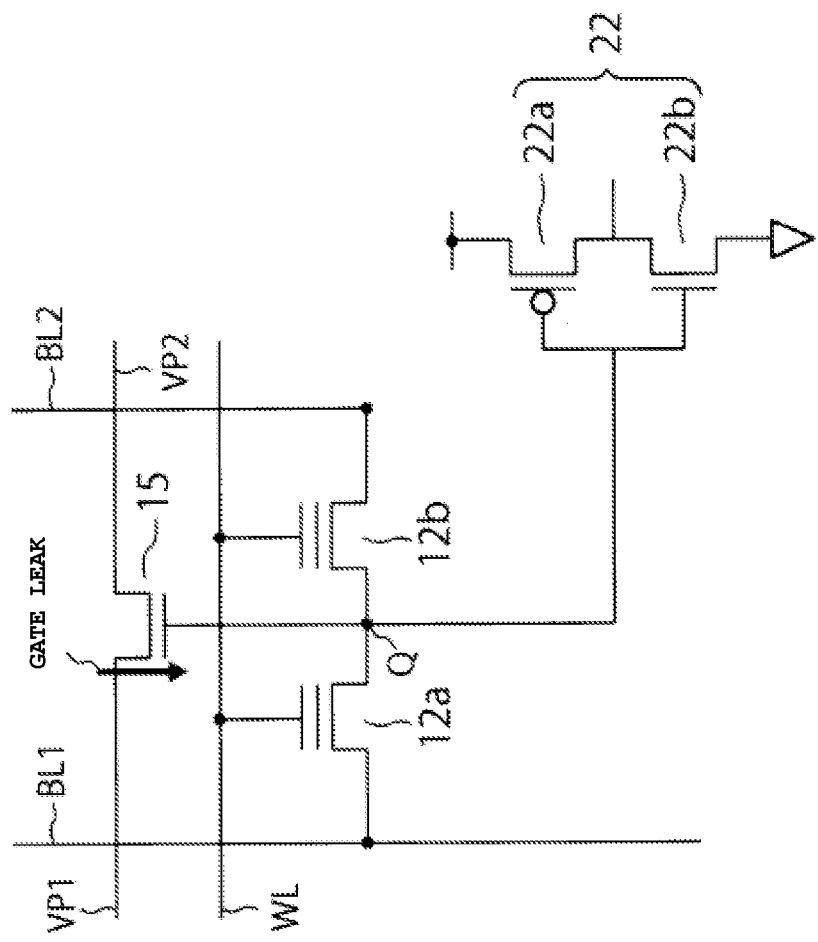

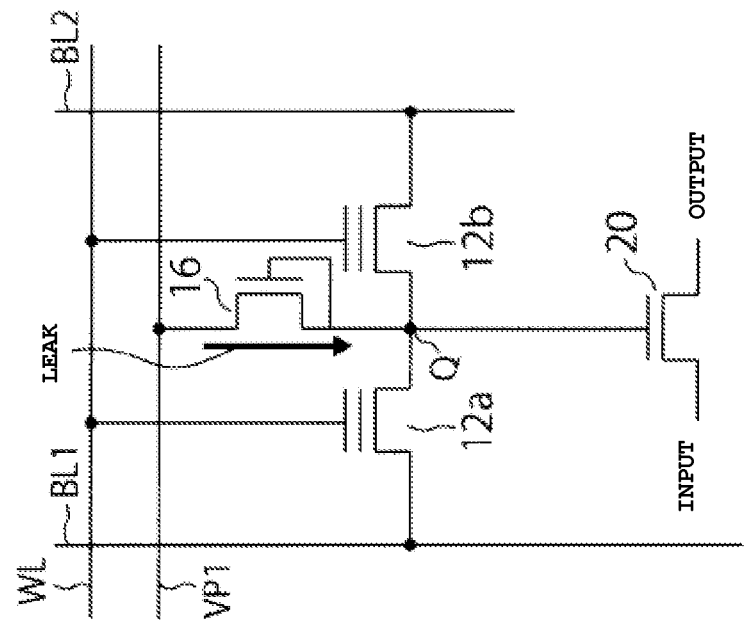

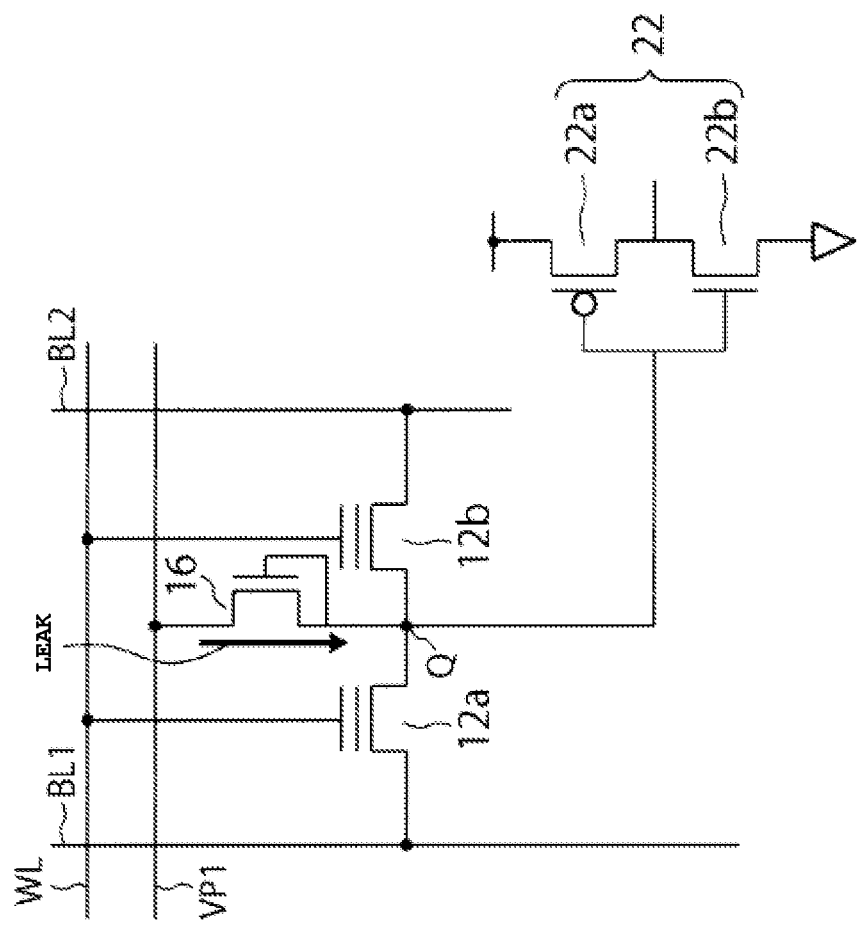

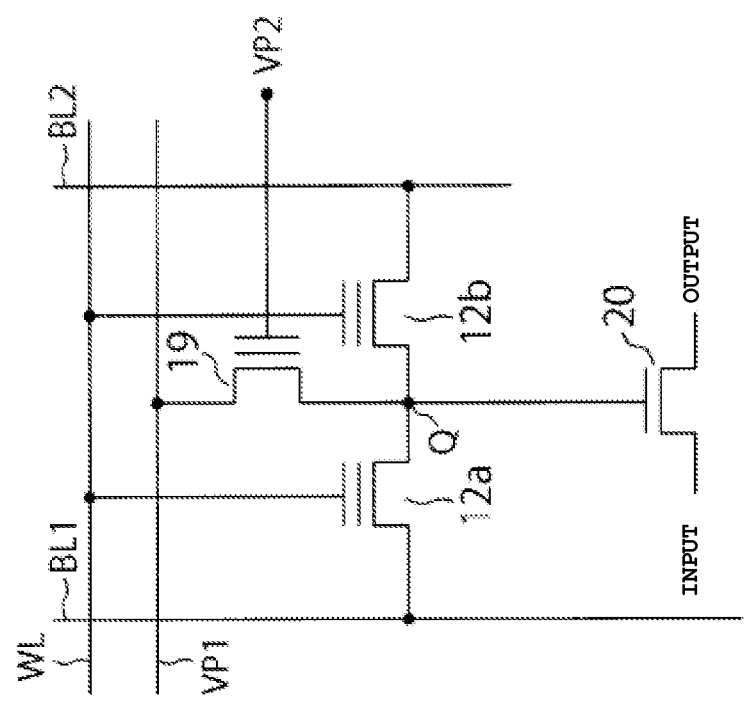

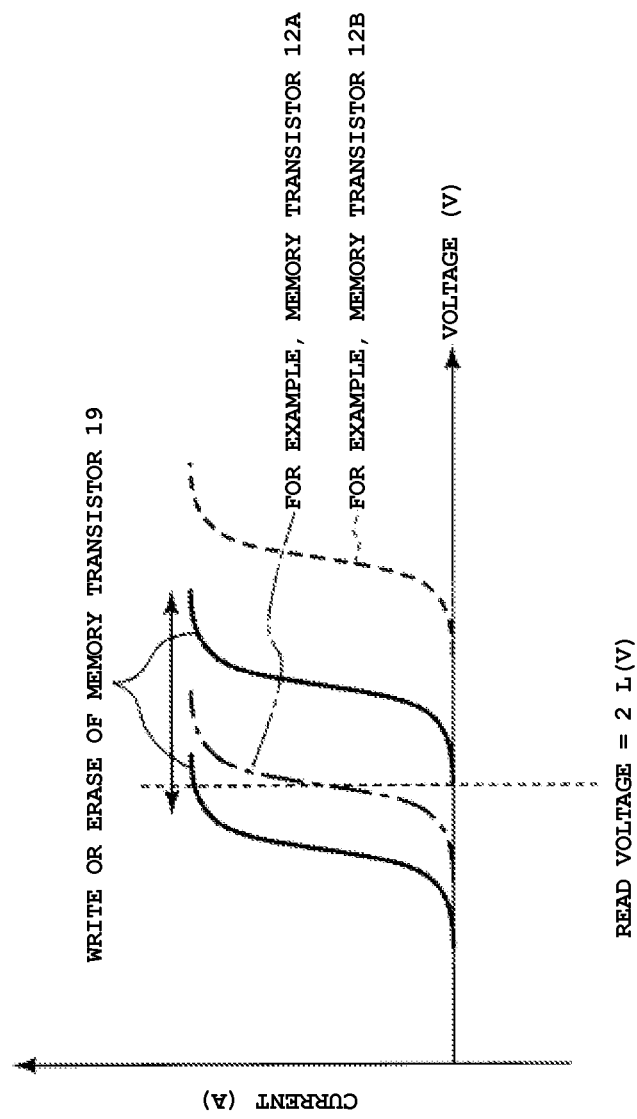

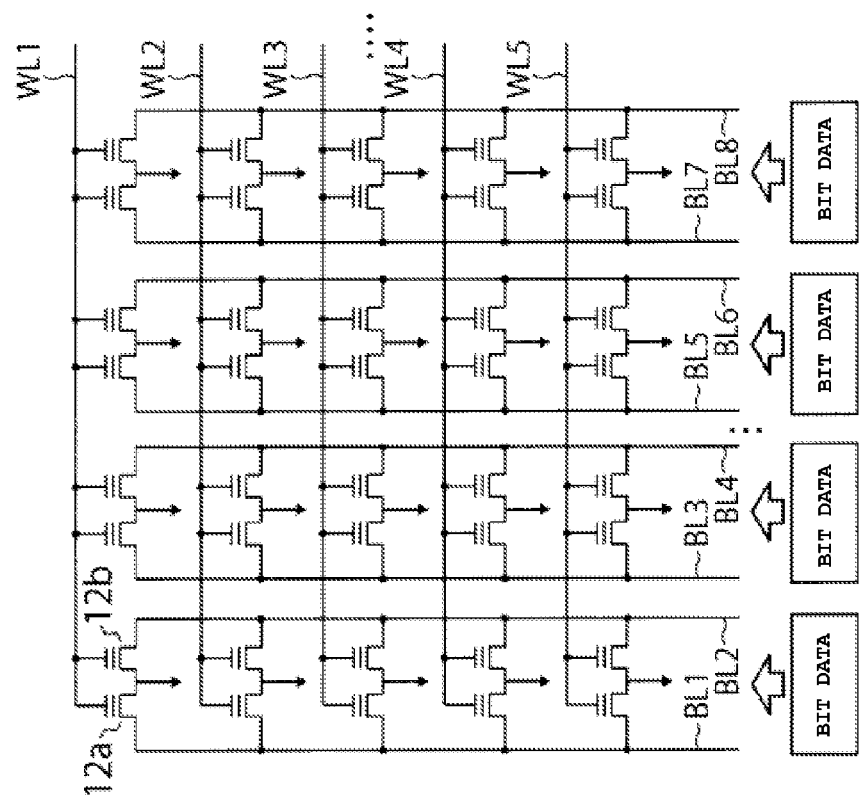

RECONFIGURABLE INTEGRATED CIRCUIT DEVICE AND WRITING METHOD THEREOF

CROSS-REFERENCE TO RELATED APPLICATION

This application is based upon and claims the benefit of priority from Japanese Patent Application No. 2012-169742, filed Jul. 31, 2012; the entire contents of which are incorporated herein by reference.

FIELD

Embodiments described herein relate to a reconfigurable integrated circuit device and a writing method thereof.

BACKGROUND

FPGA (Field Programmable Gate Array) is an IC (Integrated Circuit) that can realize various logic functions. A common FPGA has tiles containing a logic block (LB) that perform logic operations and a switch block (SB) with a switchable connection to each LB. These FPGA blocks have a plurality of programmable memories, and by writing to those memories, FPGA can be programmed to provide a logic function based on the written information. In these memories, for example, a volatile SRAM (Static Random Access Memory) can be used to store the written information.

SRAM cells that constitute SRAM arrays are written at the same speed as the switching speed of an inverter and, as long as it continues to receive power, the stored data is retained in the cells. SRAM cells include, for example, six transistors, which causes a relatively large device footprint. In addition, SRAM requires a large amount of power consumption due to the requirement that it be continuously supplied with power; otherwise, it would lose the stored data.

As one method for solving the problem of large power consumption, an FPGA may use various nonvolatile memories, for example, a flash memory. However, the flash memory generally requires a relatively long time to write or erase compared with SRAM. For this reason, a large amount of time and cost is incurred when the flash memory needs to be written or erased, for example, at the time of a logic operation test before shipping, or the like.

In addition, as one method of solving the problem of a large footprint, an FPGA may use DRAM (Dynamic Random Access Memory). Writing to DRAM provides the same operation speed as the transistor switching speed. DRAM also has a relatively small footprint since DRAM cells includes just one transistor and one capacitor.

However, a DRAM loses data due to the leakage current of the transistor, so it is necessary to frequently carry out a refresh operation. This is advantageous in the case of carrying out a logic operation test in which writing and erasing must be completed in a short time; however, it is generally necessary to use a memory that does not need to be refreshed under normal operating conditions since the rewriting of memory may be seldom or rare for normal operation.

It has been proposed to use a DRAM cell in a first instance as a DRAM cell, then convert the DRAM cell to a nonvolatile storage cell by causing damage to the gate of the transistor that constitutes DRAM. However, with this method, writing can only be done once when the device is used as a nonvolatile FPGA because this method employs a destructive technique (i.e., once the transistor gate is damaged, it cannot generally be repaired in the normal course of operation).

Thus, while high speed writing is possible when using SRAM, power consumption becomes an issue when writing is frequent, and the SRAM footprint is large. While it is possible to reduce the footprint by using DRAM, and to eventually make it nonvolatile by a destructive technique, writing can only be done once.

DESCRIPTION OF THE DRAWINGS

FIGS. 1A to 1D illustrate FPGA according to an embodiment.

FIG. 2A and FIG. 2B are circuit diagrams illustrating memory cells of a memory according to a first and a second embodiments, respectively.

FIG. 4A and FIG. 4B are circuit diagrams illustrating memory cells of a memory according to a third and a fourth embodiments, respectively.

FIG. 6A and FIG. 6B are circuit diagrams illustrating memory cells of a memory according to a fifth and a sixth embodiments, respectively.

FIG. 7A and FIG. 7B are circuit diagrams illustrating memory cells of a memory according to a seventh and an eighth embodiments, respectively.

FIG. 8A and FIG. 8B are circuit diagrams illustrating memory cells of a memory according to a ninth and a tenth embodiments, respectively.

FIG. 9A and FIG. 9B depict a writing method using CHE.

FIG. 13A and FIG. 13B are circuit diagrams illustrating memory cells of a memory according to a fifteenth and a sixteenth embodiments, respectively.

FIG. 15A and FIG. 15B are circuit diagrams illustrating memory cells of a memory according to a seventeenth and an eighteenth embodiments, respectively.

FIG. 16A and FIG. 16B are circuit diagrams illustrating memory cells of a memory according to a nineteenth and a twentieth embodiments, respectively.

FIG. 19A and FIG. 19B are circuit diagrams illustrating memory cells of a memory according to a twenty-fifth and a twenty-sixth embodiments, respectively.

FIG. 20A and FIG. 20B depict a writing and erasing of a memory transistor used as an additional circuit.

FIG. 22A and FIG. 22B depict a first example of the writing method.

DETAILED DESCRIPTION

In general, embodiments of the present disclosure will be explained with reference to the drawings.

A reconfigurable integrated circuit device includes a memory unit for storing configuration information. The memory unit has a nonvolatile memory transistor having a gate connected to a first wire, a first terminal (source or drain) connected to a second wire, and a second terminal (drain or source) connected to a third wire. The memory unit also includes a switch circuit connected to the third wire. The switch unit may, for example, be a pass transistor or an inverter circuit. The integrated circuit device additionally includes a data supply circuit for supplying bit data and a first power supply circuit for supplying voltages to the first wire. The power supply circuit is configured to supply a write voltage to the first wire to store bit data in the first nonvolatile memory transistor and to supply a select voltage and then a non-select voltage to the first wire to store bit data as a charge level on the third wire.

The reconfigurable integrated circuit device according to an embodiment includes first to third wirings, a first nonvolatile memory transistor in which the gate is connected to the first wiring, with either one of the source and the drain being connected to the second wiring while the other one of the source and the drain is connected to the third wiring, a switch circuit having its gate connected to the third wiring, a first power supply circuit that is applied to the first wiring by selecting one of the following voltages: a write voltage for writing information to the first nonvolatile memory transistor, an erase voltage for erasing the information from the first nonvolatile memory transistor, or a select voltage for turning on the first nonvolatile memory transistor, and includes a data supply circuit for supplying to the second wiring, the bit data for storing in the third wiring.

Figure 1A:
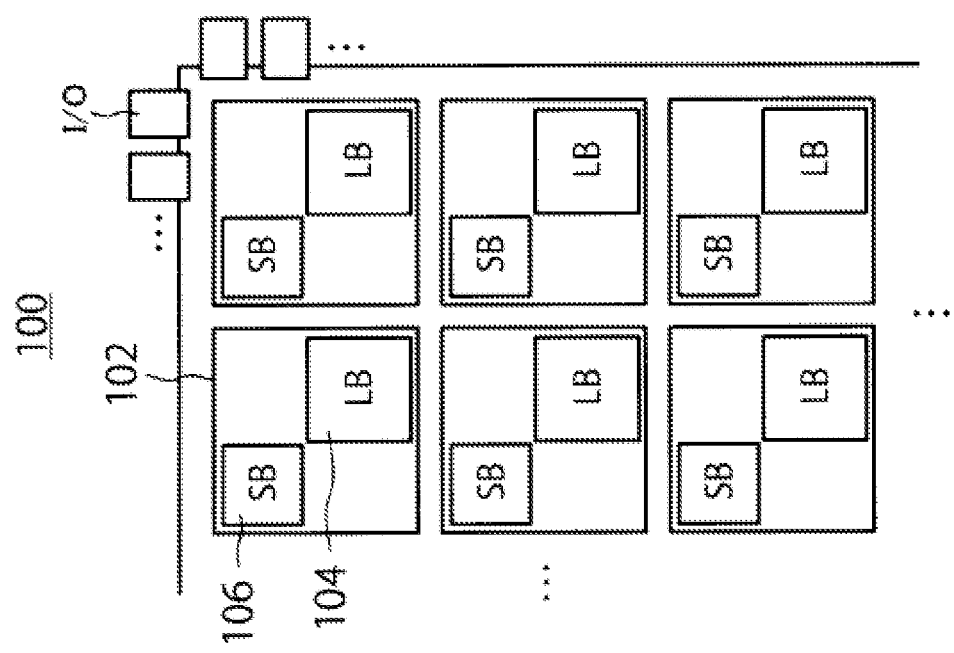
Figure 1B:
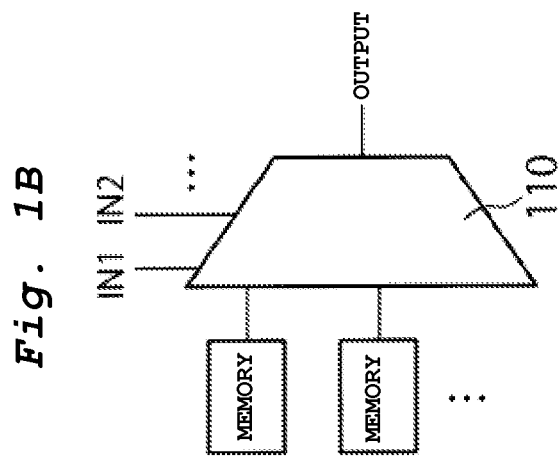
Figure 1C:
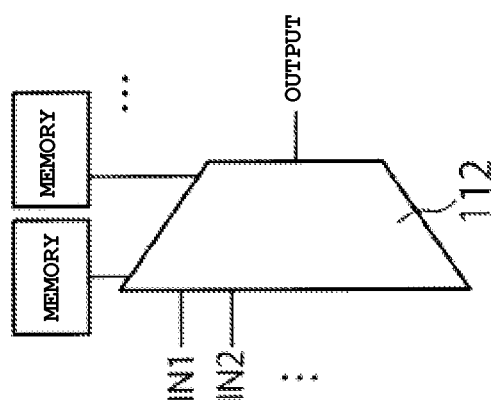

A reconfigurable integrated circuit device (hereinafter may also be called an integrated circuit device) will be explained with reference to FIG. 1A to FIG. 34. The integrated circuit device of this embodiment is an FPGA, and its outline is shown in FIG. 1A to FIG. 1D. FIG. 1A shows an FPGA 100 of this embodiment. This FPGA 100 includes a plurality of basic tiles 102 arranged in an array and an input/output part I/O arranged surrounding the array of these basic tiles 102. Each basic tile 102 has a logic block (hereinafter will also be called LB) 104 and a switch block (hereinafter will also be called SB) 106. As shown in FIG. 1B and FIG. 1C, the logic block 104 has a multiplexer 110 or a multiplexer 112, providing a logic function. The multiplexer 110 as shown in FIG. 1B provides an output signal by selecting at least one of the output signals from several memories based on two input signals IN1 and IN2. The multiplexer 112 shown in FIG. 1C provides an output signal by selecting at least one from among several input signals IN1, IN2, etc., based on the signals from two memories. The switch block 106 shown in FIG. 1D has several switches 114a and 114b that turn on and off based on the information stored in the memory, and has the function of changing the wire connection combination according to these switches. In this way, the memories that stored the information are provided in the logic block 104 and the switch block 106. Any logic can be realized in the FPGA by rewriting the information stored in these memories. The information stored in these memories is input from the outside via an input/output unit I/O.

Figure 2A:
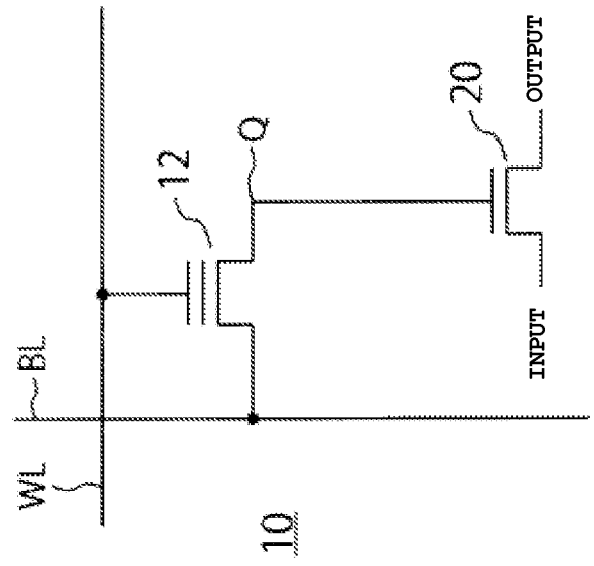

FIG. 2A and FIG. 2B show the first and the second embodiments of the memories used in the FPGA of one embodiment. The memory of the first embodiment shown in FIG. 2A has at least one memory cell 10, and each memory cell 10 has a nonvolatile memory transistor (hereinafter will also be called a memory transistor) 12, and a switch circuit 20. In the first embodiment, the switch circuit 20 is also called a pass transistor, which is an n-channel MOS transistor. The memory transistor 12 is a flash memory transistor. The flash memory transistor includes a source and a drain provided separated from a semiconductor layer, a first insulating layer provided on the semiconductor layer that becomes the channel between the source and the drain, a charge storage film provided on the first insulating layer, a second insulating layer provided on the charge storage film, and a control gate provided on the second insulating layer.

The flash memory transistor 12 may be an FG (Floating Gate) type of transistor that uses a floating gate as the charge storage layer, or it may be a MONOS (Metal-Oxide-Nitride-Oxide-Semiconductor) type of transistor that uses an insulating silicon nitride film as the charge storage layer. If the gate electrode is made of polysilicon, it may also be called the SONOS (Silicon-Oxide-Nitride-Oxide-Silicon) type of memory transistor; however, in this case, it will be called a MONOS-type memory transistor.

The use of a MONOS-type transistor will generally achieve better compatibility in a process with a switch circuit such as a pass transistor; the memory and the logic circuit can be made close to each other, making consolidation possible, and it is possible for the footprint to become smaller. The memory transistor 12 has one of its source/drain connected to the bit line BL, the other one of its source/drain connected to the node (wiring) Q, and its gate connected to the word line WL. The node Q is connected to the gate of the pass transistor 20.

The memory of the second embodiment shown in FIG. 2B has at least one memory cell 10A; each memory cell 10A has a configuration in which the switch circuit 20 is replaced with an inverter 22 in the memory cell 10 of the first embodiment shown in FIG. 2A. The inverter 22 has a p-channel MOS transistor 22a and an n-channel MOS transistor 22b. The gates of this inverter 22, which are the gate of the p-channel MOS transistor 22a and the gate of the n-channel MOS transistor 22b, are connected to the node Q.

In both the first and the second embodiment either the source or drain of the memory transistor 12 is connected to the gate of the pass transistor 20 or the inverter 22 via the node Q. Depending on configuration, either of the source/drain of memory transistor 12 may be connected to node Q without departing from contemplated embodiments.

Figure 3:
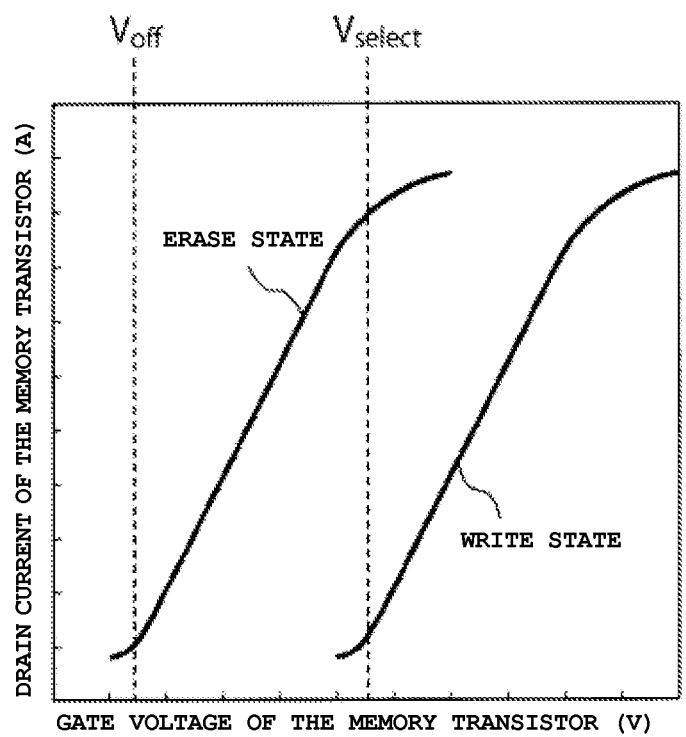
FIG. 3 depicts the writing and erasing characteristics of a memory transistor.

In the memory transistor 12, writing is carried out by storing the charge in the charge storage layer and erase is carried out by pulling the charge from the charge storage layer. In either case, the threshold voltage of the memory transistor changes depending on the amount of charge inside the charge storage layer. FIG. 3 shows the gate voltage dependence of the drain current in the memory transistor 12. In general, writing and erasing require a time of several hundred nanoseconds (ns) to several microseconds (μs).

When all the memory cells are in the state of erasure, a select voltage $V_{select}$, which is a voltage that turns on the memory cell, is applied to the word line WL to which the memory cell to be selected is connected. The select voltage $V_{select}$ is lower than the writing voltage. The potential of the bit line BL is set to a high level or low level; after that, by applying an off voltage (non-select voltage) $V_{off}$ to the word line WL, the charge (data) can be stored in the gate capacitance of the switch circuits 20 or 22 connected to the memory transistor 12 (hereinafter this will also be called DRAM operation). Here, the gate capacitance of the switch circuits 20 and 22 refers to a parasitic capacitance of the node Q (wiring) between the gate of switch circuits 20 and 22 and the source/drain of the memory transistor 12 connected to this gate. With regard to the non-selected memory cells, the off signal $V_{off}$ is applied to the word line and the memory transistor 12 is set to the off status. The storage of charge can be completed at a high speed approximately equal to that of the operating speed (typically on the order of picoseconds) of the memory transistor 12. The pass transistor 20 or inverter 22 connected by the potential according to the charge can be operated until the stored charge is lost due to a leakage component.

Figure 4A:
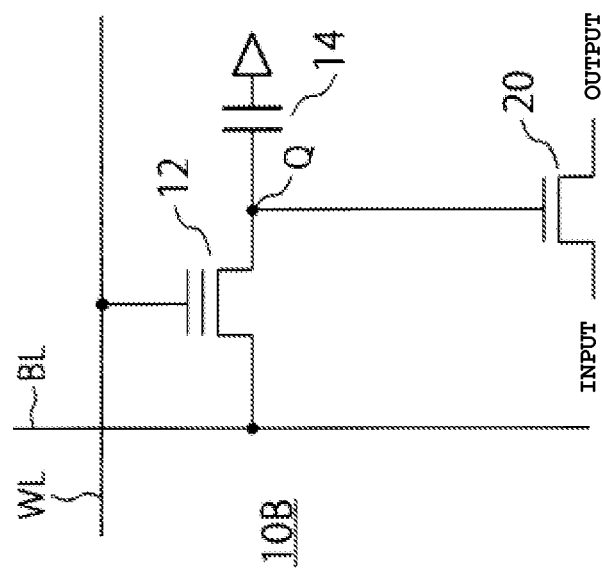

This gate capacitance can store a larger amount of charge by adding capacitance via, for example, a capacitor, and can also retain the potential for a longer period of time using this design. FIG. 4A and FIG. 4B show the memory cells of the memory according to the third and the fourth embodiments to which a capacitance has been added to the previously described embodiments. The memory cell 10B shown in FIG. 4A has a configuration in which an additional circuit, for example, a capacitor 14, is provided to the gate capacitance of the memory cell 10 shown in FIG. 2A, and the memory cell 10C shown in FIG. 4B has a configuration in which the capacitor 14 is provided to the gate capacitance of the memory cell 10A shown in FIG. 2B. An additional circuit as used in this context can include a capacitor, a resistor, a transistor, a diode, and similar elements for increasing the amount of charge or retention time of charge stored during DRAM operation.

Figure 5:
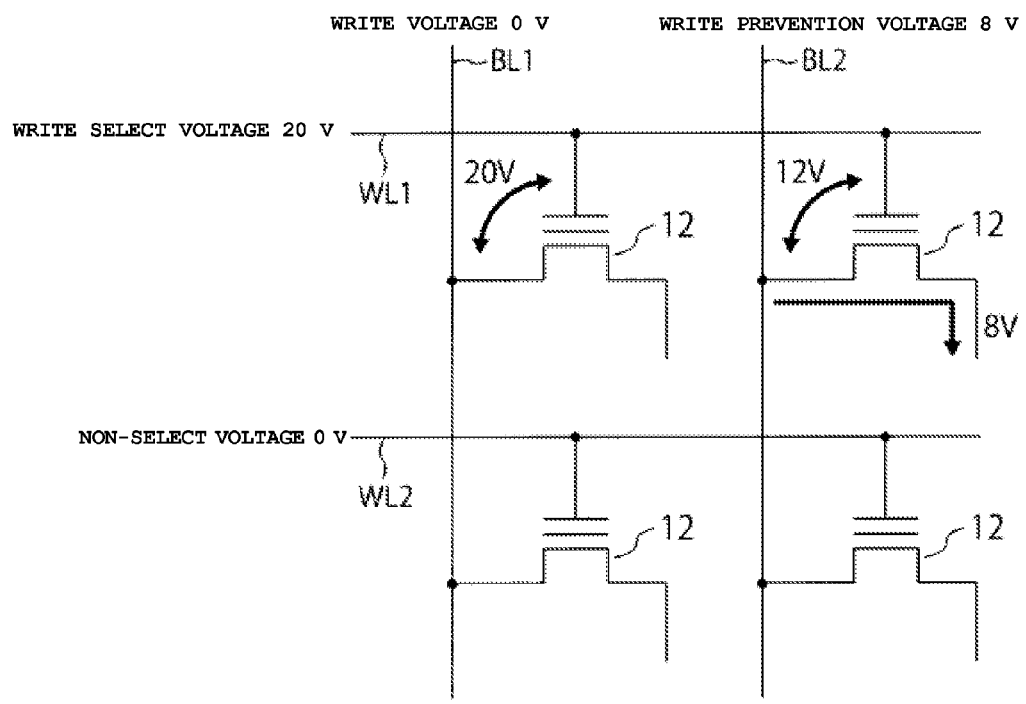
FIG. 5 depicts a writing method of a memory.

Next, the writing method of data to the memory transistor 12 of the memory according to the first and/through the fourth embodiments will be explained with reference to FIG. 5. In FIG. 5, the memory cells the embodiments mentioned previously are arranged in a matrix form, with each memory cell showing the memory transistor 12; however, the switch circuit will not be shown in the drawing.

Each memory transistor 12 carries out writing or erasing by injecting or pulling the charge according to the FN (Fowler-Nordheim) tunneling current. Writing is carried out by applying a write voltage (for example, 20 V) to the word line WL1 connected to the memory cells to be written, and by applying a write voltage (for example, 0 V) to the bit line BL1. At that time, a writing prevention voltage of 8 V is applied to the bit line BL2 of the non-selected memory cell. In this way, only about 12 V of voltage is applied to the non-selected memory cell that shares the memory cells to be written and the word line WL1, between the gate and the drain, so there will be no writing by the FN tunneling current.

In the state wherein 0 V or positive voltage (voltage of greater than 0 V) is applied to the electrodes (substrate electrodes) for applying the voltage (substrate bias) to the semiconductor layer in which the memory cells are formed at the time of erasing the information from the memory cells, a negative erase voltage is applied to the selected word line. The erase voltage is, for example, −20 V. At this time, the memory cells connected to the same selected word line are erased all at once. At the time of the memory operation, a high level is given to all bit lines and a select voltage $V_{select}$ is applied to all word lines; by doing so, the memory cells at the erase state have the memory transistor 12 turned on, so a high level is applied to the gate of the switch circuit (for example, the pass transistor 20), and the memory cells at the writing state have the memory transistor turned off, so no voltage is applied to the gate of the switch circuit (see FIG. 3).

In the first through fourth embodiments shown in FIG. 2A, FIG. 2B, FIG. 4A and FIG. 4B, the gate of the switch circuit connected to the memory cells (the memory cells into which a low level is given to the gate of the switch circuit) at the writing state during the memory operation becomes the floating state. When the gate becomes the floating state, the potential tends to increase by the charge due to the leakage current or the like.

Figure 6B:
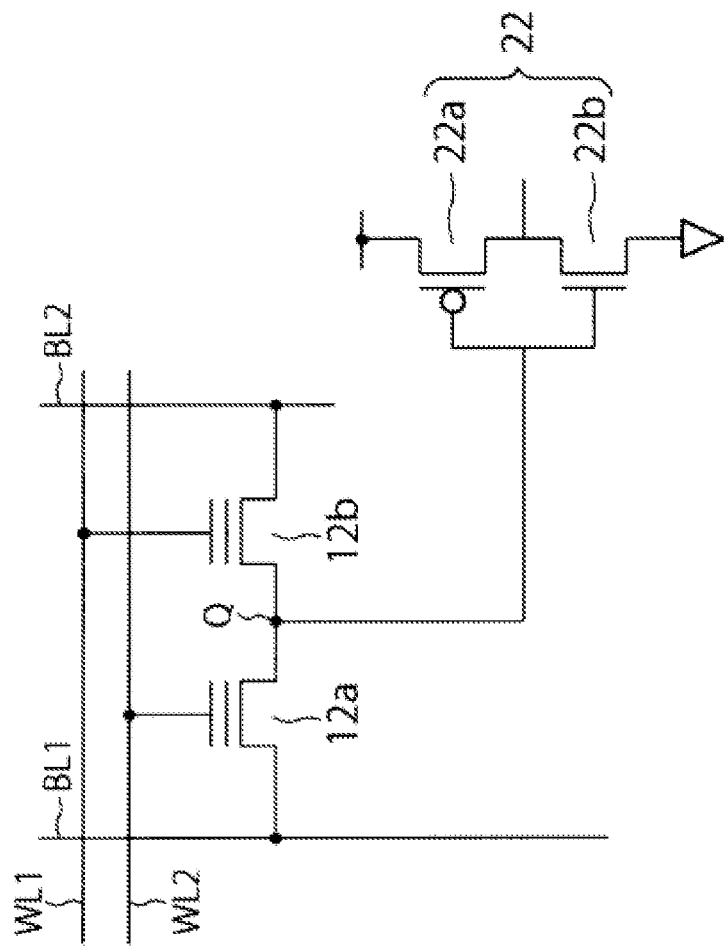

This problem can be solved by preparing the memories of the fifth and sixth embodiments as shown in FIG. 6A and FIG. 6B, and carrying out a complementary writing. The memory of the fifth embodiment as shown in FIG. 6A has a memory transistor 12a that has one of its source/drain connected to the bit line BL1 and its gate connected to the word line WL1, a memory transistor 12b that has one of its source/drain connected to the BL2 and its gate connected to the word line WL2, and a pass transistor 20 that has its gate connected to the other one of the source/drain of the memory transistor 12a and the other one of source/drain of the memory transistor 12b. That is to say, the memory of the fifth embodiment has a configuration that shares the pass transistor 20 with different memory cells. The memory of the sixth embodiment shown in FIG. 6B has a configuration in which the pass transistor 20 is replaced with inverter 22. In other words, the memory of the sixth embodiment has a configuration that shares the inverter 22 with different memory cells.

Next, the effect of complementary writing to the memory transistors 12a and 12b in these fifth and sixth embodiments will be explained. To be precise, a select voltage $V_{select}$ is applied to the word line WL1 and the word line WL2 and, for example, a voltage at a high level is applied to the bit line BL1 and a voltage at a low level is applied to the bit line BL2. At this time, when the memory transistor 12a is in the writing state and the memory transistor 12b is in the erasing state, a high level is applied to the gate of the switch circuits 20 and 22. On the contrary, when the memory transistor 12a is in the erasing state and the memory transistor 12b is in the writing state, a low level is applied to the gate of the switch circuits 20 and 22. In this way, by carrying out a complementary writing, it is possible to prevent the gate of the switch circuits 20 and 22 from becoming the floating state; it is also possible to prevent the potential from increasing due to the charge due to a leakage current or the like.

Also in the fifth and the sixth embodiments shown in FIG. 6A and FIG. 6B, similar to that in the first to fourth embodiments shown in FIG. 2A, FIG. 2B, FIG. 4A and FIG. 4B, DRAM operation while all memory cells are in the erase state is possible. To be precise, the charge is accumulated by putting all of the memory cells in the erase state, applying a voltage $V_{select}$ to the word line WL1, a voltage $V_{off}$ to the word line WL2, a voltage at a high level or a low level to the bit line BL1, and also a voltage $V_{off}$ to the word line WL1 thereafter. Alternatively, the charge is accumulated by applying the voltage $V_{select}$ to both the word line WL1 and the word line WL2, the voltage at a high level or a low level to both the bit line BL1 and the bit line BL2, and thereafter the voltage $V_{off}$ to the word line WL1 and the word line WL2.

Figure 7A:
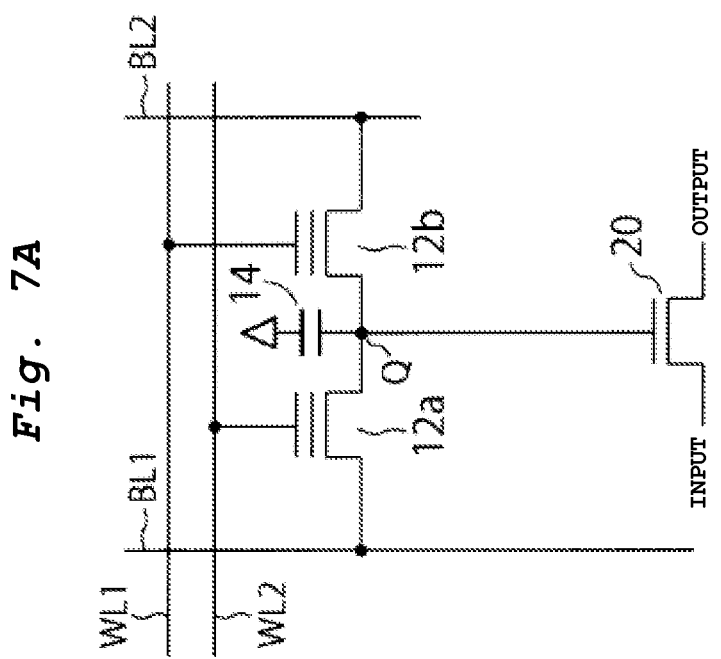

In addition, similar to that in the third and fourth embodiments shown in FIG. 4A and FIG. 4B, the memory of the fifth and sixth embodiments shown in FIG. 6A and FIG. 6B may be configured so that the capacitance of the capacitor 14 is added to the gate capacitance by providing an additional circuit, for example, the capacitor 14. This is shown in FIG. 7A and FIG. 7B. FIG. 7A and FIG. 7B are circuit diagrams illustrating the memory of the seventh and the eighth embodiments. In this way, the gate capacitance can be made larger by providing the capacitor 14, making it possible to hold the charge for a long period of time.

The writing to the memory transistors 12, 12a, and 12b in the memory of the first to eighth embodiments assumes the injection and the withdrawal of the charge by the FN tunneling current. However, in the writing method by the FN tunneling current, 8 V of voltage is applied to the gate of the memory transistors 12, 12a, and 12b of the non-selected memory cells shown in FIG. 5. In this way, it becomes necessary to provide measures such as equipping the pass transistor or the inverter connected to the memory transistors 12, 12a, and 12b with a gate oxide film having a thickness that can withstand 8 V, or to only apply voltages that will not damage the substrate, the source, or the drain.

In contrast, there is no need to apply such a high voltage to the bit line in writing using CHE (channel hot electron), reducing the load of the pass transistor or the inverter connected to the memory transistor. ACHE is an electron having an extremely high energy, and occurs when the drain voltage of a transistor becomes larger than a certain value, with the channel causing a pinch off at the drain terminal. Writing to the memory cells is achieved by withdrawing the CHE to the charge storage layer by the gate voltage, the CHE of which is generated by the potential difference between the source and the drain. The writing system using CHE has an advantage in that it has a small voltage value that is applied to each terminal compared to a writing system using the FN current.

However, there is a problem of the chip area becoming larger by providing an access transistor to realize a selective writing to one of the memory transistors. The voltage of the word line for writing is, for example, 10 V, and the voltage of the bit line for writing is, for example, 4 V.

Figure 8A:
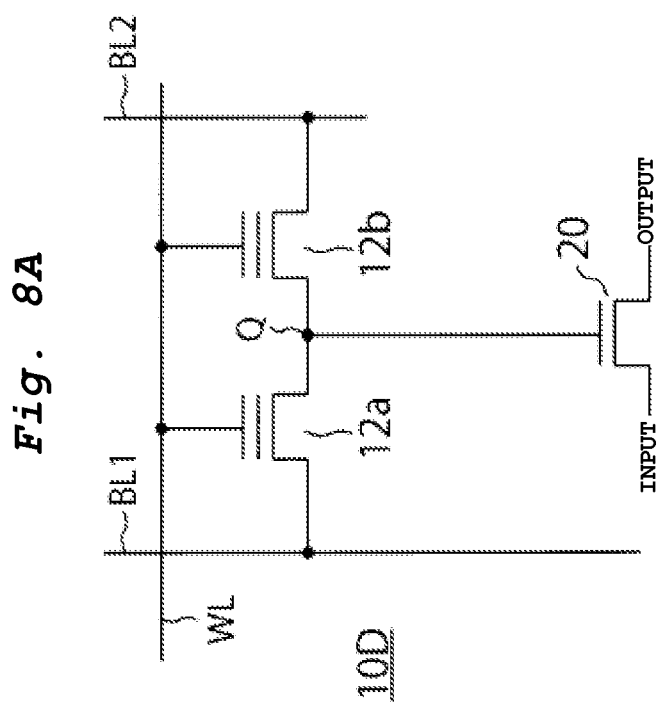

The memory suitable for this writing system using CHE will be explained with reference to FIG. 8A and FIG. 8B. FIG. 8A and FIG. 8B are circuit diagrams illustrating the memory cells of the memory according to the ninth and tenth embodiments. The memory cell 10D according to the ninth embodiment shown in FIG. 8A has a memory transistor 12a that has one of its source/drain connected to the bit line BL1, the other one of its source/drain connected to the node Q, and its gate connected to the word line WL; a memory transistor 12b that has one of its source/drain connected to the bit line BL2, the other one of its source/drain connected to the node Q, and its gate connected to the word line WL; and a pass transistor 20 that has its gate connected to the node Q. That is, the other one of the source/drain of the memory transistor 12a and 12b, and the gate of the pass transistor 20, are both connected to the node Q. The memory cell 10E according to the tenth embodiment shown in FIG. 8B has a configuration in which the pass transistor 20 is replaced with the inverter 22, in the memory cell 10D according to the ninth embodiment shown in FIG. 8A.

Figure 9B:
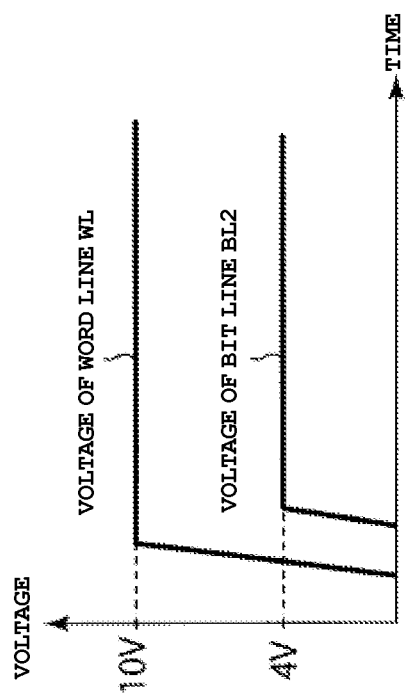

Next, the writing method that uses CHE in the memory according to the ninth and tenth embodiments will be explained with reference to FIG. 9A and FIG. 9B.

When the first writing voltage (10 V) is applied to the word line WL, both memory transistors 12a and 12b are turned on. Here, since the FN current requires a voltage of about 20 V, no writing will occur to memory transistors 12a and 12b at this writing voltage. Under this condition, when the second voltage (4 V) is applied to the bit line BL2, there is a difference in the gate potential difference (hereinafter this difference will be referred to as the drive voltage) with respect to the source at the memory transistor 12a and the memory transistor 12b. That is to say, the drive voltage at the memory transistor 12a will be 10 V, while the drive voltage at the memory transistor 12b will be 6 V (FIG. 9A and FIG. 9B). In general, the channel resistance of the transistor will become smaller as the drive voltage becomes larger. For this reason, the memory transistor 12a, instead of the memory transistor 12b, will become low resistance. Assuming R1 as the channel resistance of the memory transistor 12a, R2 as the channel resistance of the memory transistor 12b, VBL1 and VBL2 as the voltages, i.e., the voltages of the first and second power sources applied to the bit lines BL1 and BL2, respectively, and VQ as the potential of the node Q, VQ is expressed by the following formula.

$$VQ=(R1/(R1+R2))\times(VBL2-VBL1)$$

Here, since R1<R2, VQ is smaller than (VBL2−VBL1)/2. In other words, the potential VQ of the node Q becomes a potential that is closer to the voltage VBL1 of the bit line BL1 than the voltage VBL2 of the bit line BL2, and the source-drain voltage of the memory transistor 12b becomes larger than the source-drain voltage of the memory transistor 12a.

Figure 10:
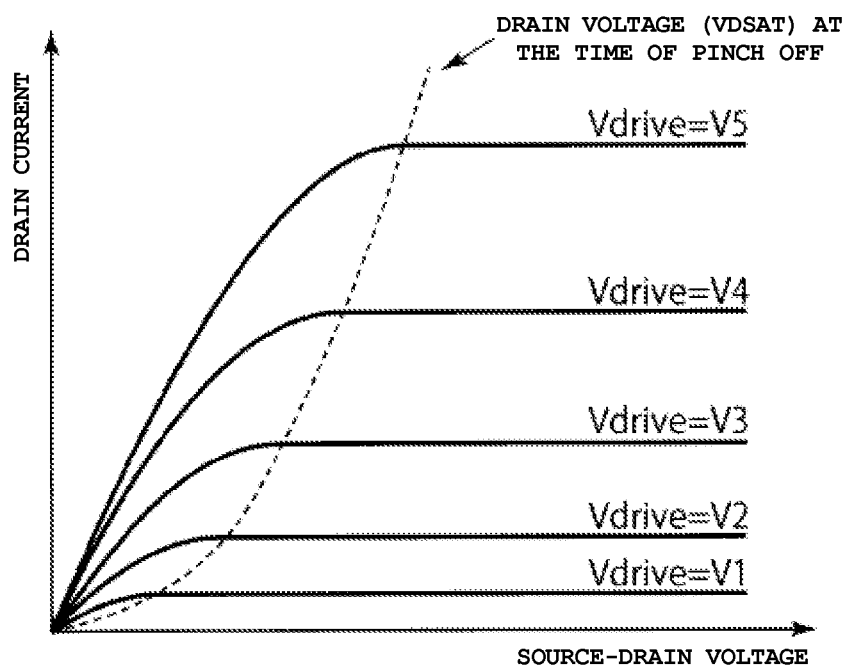
FIG. 10 illustrates a source drain voltage dependency of a drain current of a memory transistor.

The CHE occurs when the channel of the transistor is pinched-off at the drain terminal. However, when the source-drain voltage is made larger, pinch off will occur when it reaches a voltage (hereinafter will be referred to as Vdsat), and once the pinch off occurs, the drain current of the transistor will become saturated. FIG. 10 shows the characteristics of various drive voltages Vdrive of this state. FIG. 10 is an I-V characteristic diagram illustrating the source-drain voltage dependence of the drain current when the drive voltage Vdrive is used as a parameter. In FIG. 10, five types of voltages, V1, V2, V3, V4, and V5, are used as the drive voltage Vdrive. These voltages satisfy V1<V2<V3<V4<V5. The dotted line represents the channel pinch off and, in general, the larger the drive voltage, the larger the voltage Vdsat at which the drain current is saturated.

In the ninth and tenth embodiment, the drive voltage of the memory transistor 12a is larger than the drive voltage of the memory transistor 12b, so the source-drain voltage required for pinch off is larger in the memory transistor 12a than that in the memory transistor 12b. However, as has been explained before, the source-drain voltage of the memory transistor 12a is smaller than the source-drain voltage of the memory transistor 12b. For this reason, the source-drain voltage required for pinch off cannot be obtained at the memory transistor 12a, so writing by CHE will not occur. However, in the memory transistor 12b, the drive voltage is relatively small and the source-drain voltage is large, so the pinch off of the channel occurs and writing of the memory by CHE occurs, making it possible to carry out a selective writing.

Erasing the information from the memory cell is carried out by applying a negative erase voltage to the word line WL at the state of applying 0 V or a positive voltage (a voltage 0 V or more) to the substrate electrode. The erase voltage is, for example, −20 V. At this time, the memory cells connected to the same word line will be erased.

In the ninth and tenth embodiments shown in FIG. 8A and FIG. 8B, the DRAM operation can be carried out, similarly to that in the first to the eight embodiments. To be precise, the charge is accumulated by forming all memory cells in the erase state, applying a select voltage $V_{select}$ to the word line, applying a voltage at a high level or a low level to both the bit line BL1 and the bit line BL2 and, after that, applying an off voltage $V_{off}$ to the word line. An off voltage (non-selected voltage) $V_{off}$ is applied to the non-selected memory cells.

Figure 11A:
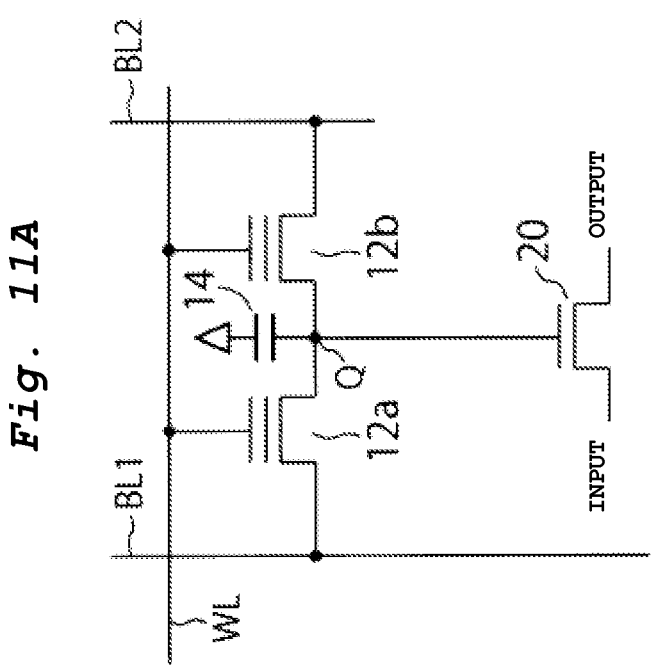
FIG. 11A and FIG. 11B are circuit diagrams illustrating memory cells of a memory according to an eleventh and a twelfth embodiments, respectively.
Figure 11B:
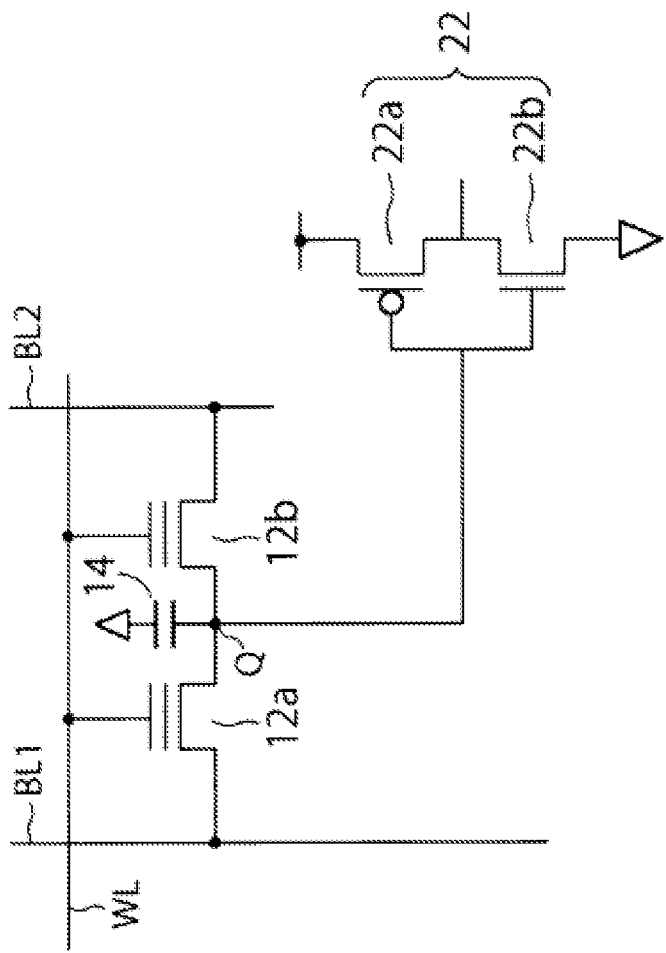

As in the third embodiment, the fourth embodiment, the seventh embodiment, and the eighth embodiment, one end is connected to the node Q of the memory cell of the ninth or tenth embodiment. By providing an additional circuit, for example, the capacitor 14, the gate capacitance can be made large. This is shown in FIG. 11A and FIG. 11B. FIG. 11A and FIG. 11B are circuit diagrams illustrating the memory of the eleventh and twelfth embodiments. In this way, providing the capacitor 14 can make the gate capacitance larger and the charge can be held for a longer period of time.

Figure 12A:
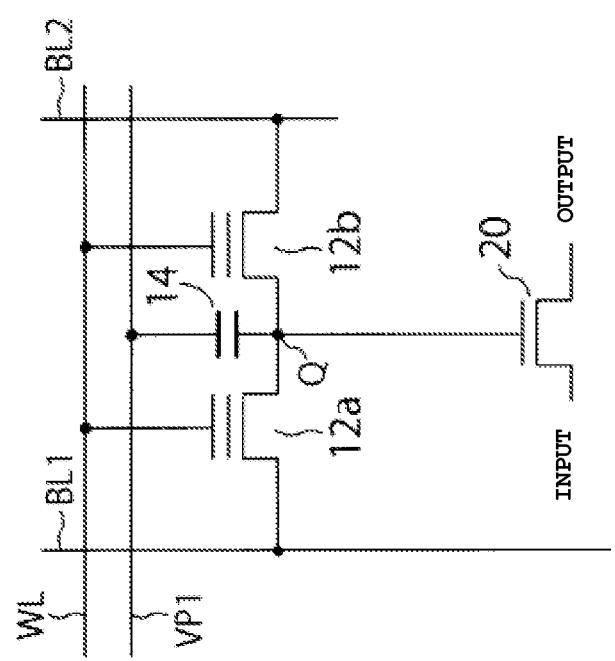
FIG. 12A and FIG. 12B are circuit diagrams illustrating memory cells of a memory according to a thirteenth and a fourteenth embodiments, respectively.
Figure 12B:
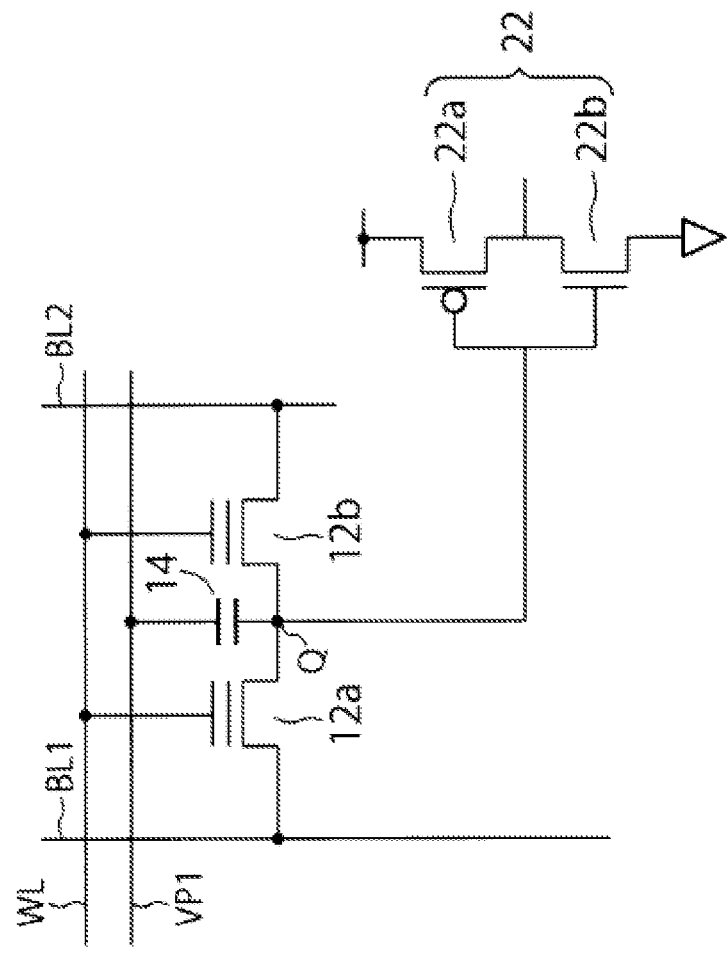

In addition, as in the thirteenth and fourteenth embodiments shown in FIG. 12A and FIG. 12B, the other end of the capacitor 14 may be connected to the power source VP1.

FIG. 13A and FIG. 13B show examples of a method of making the charge retention time longer during DRAM operation. FIG. 13A and FIG. 13B are diagrams showing the memory cells pertaining to the fifteenth and sixteenth embodiments. The fifteenth and sixteenth embodiments have a configuration in which, instead of the capacitor 14, a transistor 15 is provided as the additional circuit in the thirteenth and fourteenth embodiments shown in FIG. 12A and FIG. 12B. The transistor 15 has a configuration in which the gate is connected to the node Q and the source and the drain are connected to the power source VP1. The arrows in FIG. 13A and FIG. 13B denote the gate leakage.

Figure 14:
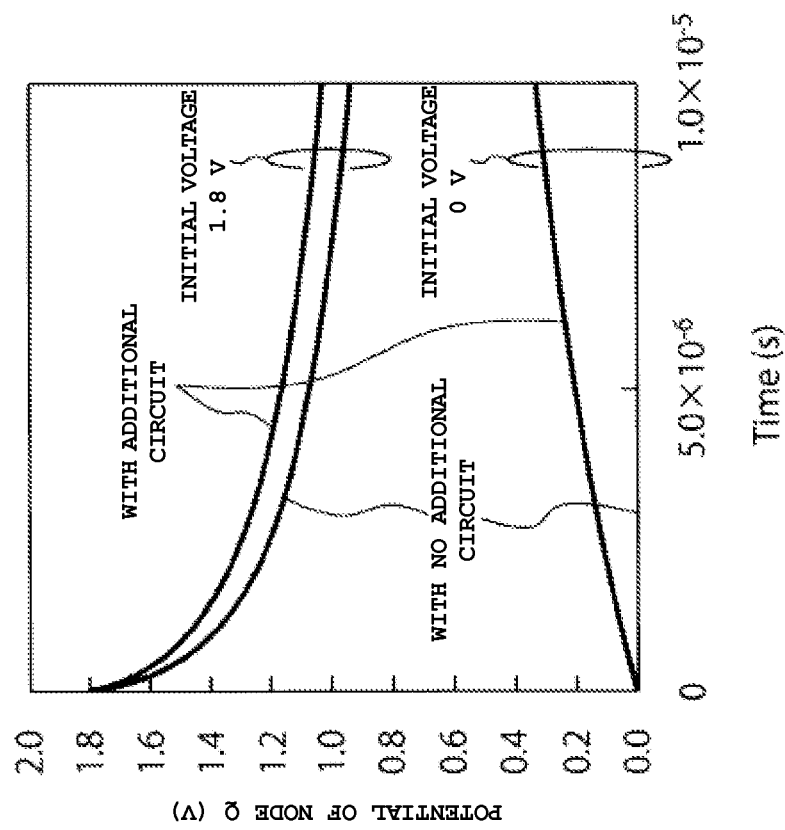
FIG. 14 illustrates a time dependency of the potential of node Q when there is an additional circuit and when there is no additional circuit.

From this configuration, the capacitance of the node Q is increased and, at the same time, the charge retention time at which the potential of the node Q is set at a high level is made longer. As in the fifteenth and sixteenth embodiments, FIG. 14 shows the result after running a simulation of time elapse in the potential of the node Q when an additional circuit is provided, and in the case when no additional circuit is provided. In this simulation, the initial potential of the node Q is set to 1.8 V and 0 V, and each is calculated. As can be seen in FIG. 14, in the potential of the node Q, the retention time at a high level (with its initial potential being 1.8 V) becomes longer. However, it is found that when retention in DRAM at a low level is desired, the potential of the node Q due to leakage current increases. It is considered that there will be no effect on the operation of the memory cells even when the voltage is increased to the threshold voltage of the pass transistor 20 connected to the node Q or to the turnover voltage of the inverter 22. In particular, the inverter 22, for example, the inverter that operates at 1 V of power source, requires −0.2 V or less at a low level and −0.8 V or higher at a high level. Therefore, for example, in a normal configuration such as that shown in FIG. 11, the low level is fixed at 0 V, and the potential will immediately decrease only when it is at a high level; however, the potential at a high level will be retained, instead of increasing the low level until 0.2 V. It is thus believed that this circuit configuration can operate for a longer period of time.

Figure 15A:
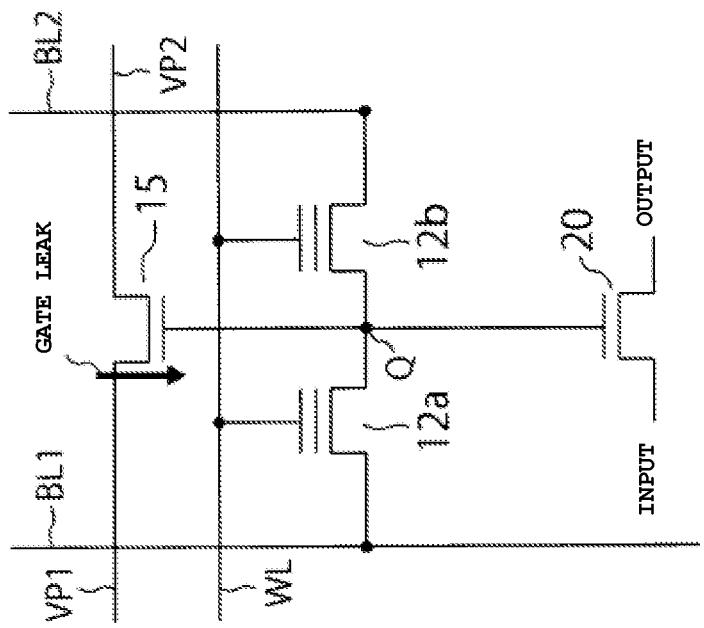
Figure 17A:
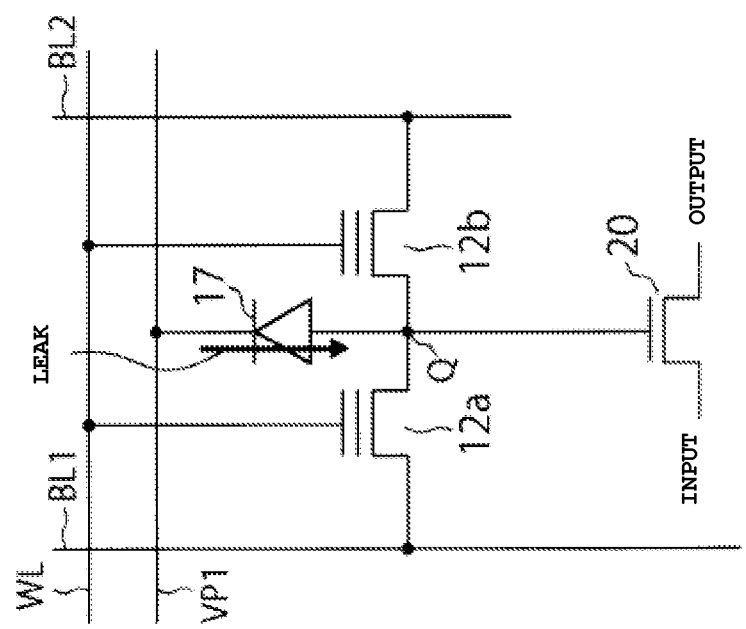
FIG. 17A and FIG. 17B are circuit diagrams illustrating memory cells of a memory according to a twenty-first and a twenty-second embodiments, respectively.
Figure 17B:
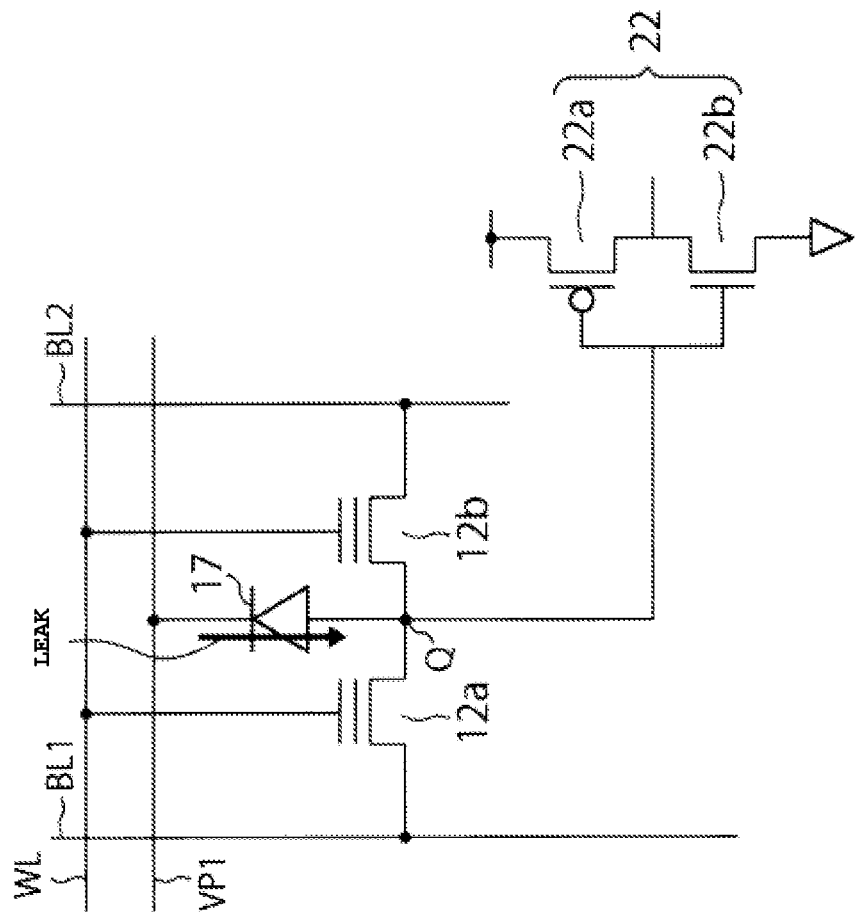

As an application of the fifteenth and sixteenth embodiments, FIG. 15A and FIG. 15B show the memory cells of the memory of the seventeenth and eighteenth embodiments. The configurations in the seventeenth and eighteenth embodiments show that one of the source and the drain of the transistor 15 is connected to the power source VP1, and the other one of the source and the drain is connected to the power source VP2. The arrows in FIG. 15A and FIG. 15B denote the gate leakage. Providing a high level of potential to the power source VP1 and the power source VP2 will achieve the same effect as that in the fifteenth and sixteenth embodiments as shown in FIG. 13A and FIG. 13B. Here, the potential of the node Q can be predicted, for example, by applying a high level to the power source VP1, applying a low level to the power source VP2, and measuring the amount of the current. In this way, at the time of the memory operation, whether writing has occurred properly at the memory transistors 12a and 12b can be confirmed.

The fifteenth and sixteenth embodiments shown in FIG. 13A and FIG. 13B and the seventeenth and eighteenth embodiments shown in FIG. 15A and FIG. 15B are the memories that use the gate leakage. In these embodiments, it is considered to be insufficient, with respect to the gate leakage, when there is a large amount of gate leakage to the pass transistor 20 or the inverter 22 connected to the node Q, or when there is a large amount of off-leak in the memory transistors 12a and 12b. Accordingly, as in the nineteenth and twentieth embodiments shown in FIG. 16A and 16B, the use of the reverse leakage of a diode-connected transistor 16 as the additional circuit has also been considered. The anode of the diode is connected to the node Q and the cathode is connected to the power source VP1. A diode 17 may also be used as the additional circuit, instead of using the diode-connected transistor as in the twenty-first and twenty-second embodiments shown in FIG. 17A and FIG. 17B.

The use of an off-leak transistor (resistance) has also been considered. This is shown in the twenty-third and twenty-fourth embodiments shown in FIG. 18A and FIG. 18B. In these twenty-third and twenty-fourth embodiments, the voltage that turns off the transistor 18 is applied by the power source VP2 connected to the gate of the transistor 18, which is the additional circuit, and voltage at a high level is applied to the power source VP1.

Figure 18A:
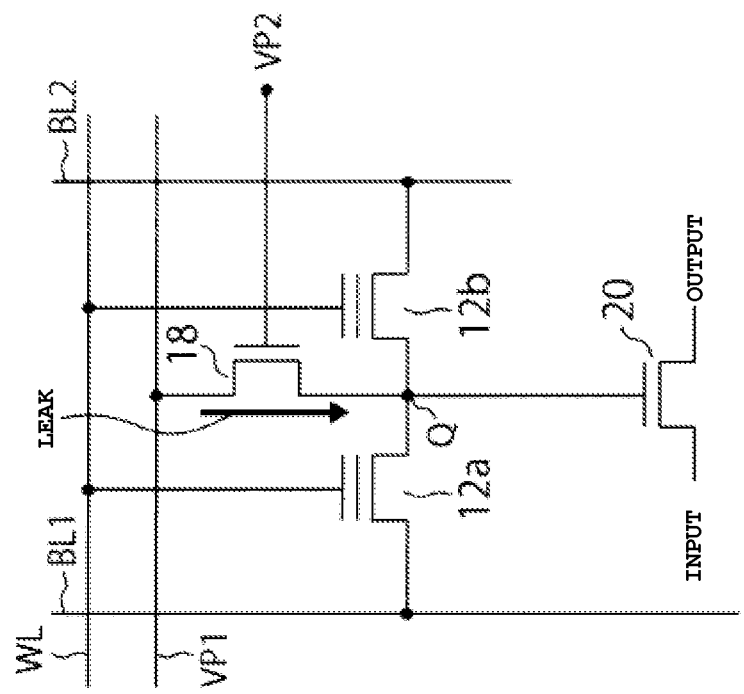
FIG. 18A and FIG. 18B are circuit diagrams illustrating memory cells of a memory according to a twenty-third and a twenty-fourth embodiments, respectively.
Figure 18B:
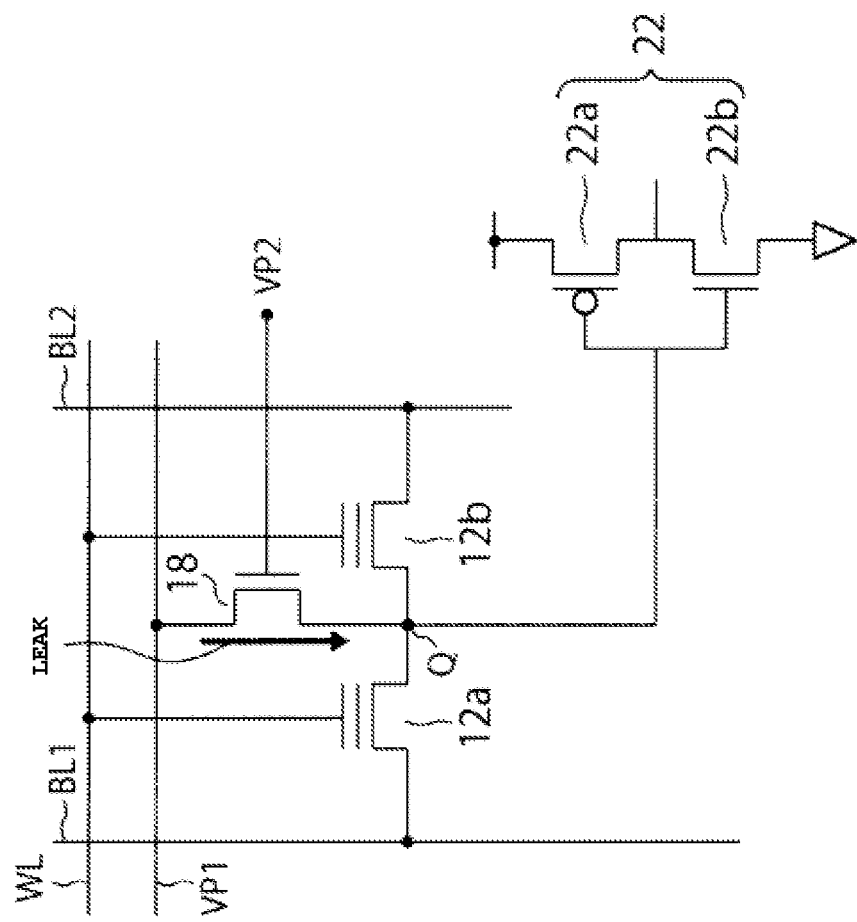
Figure 19B:
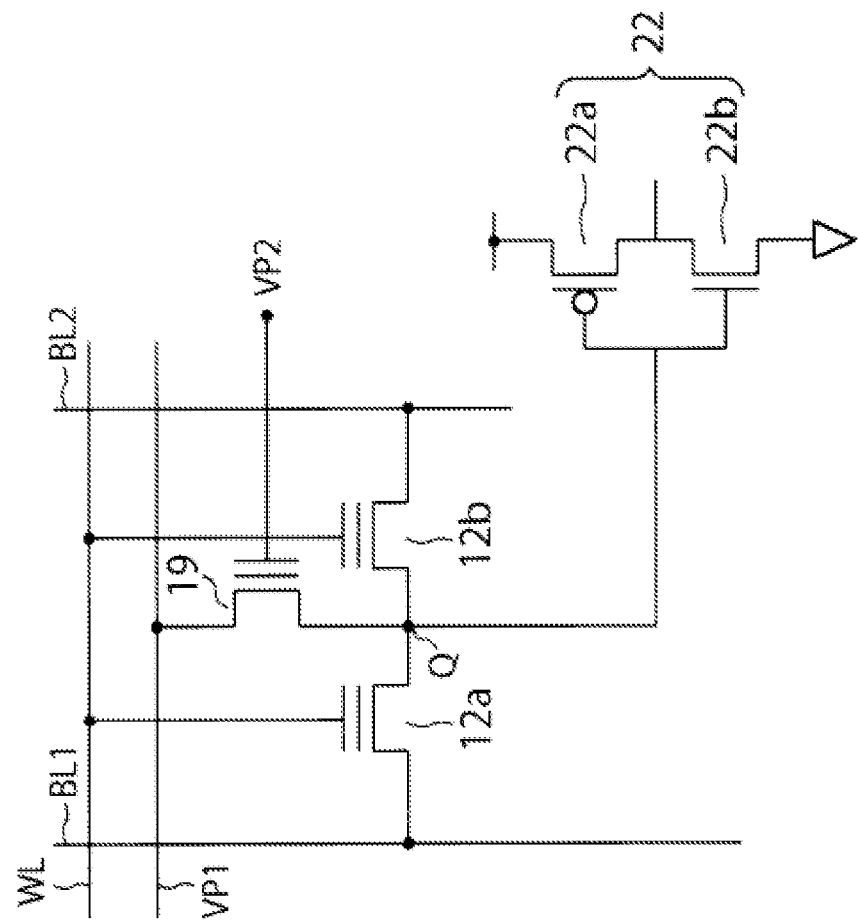
Figure 20A:
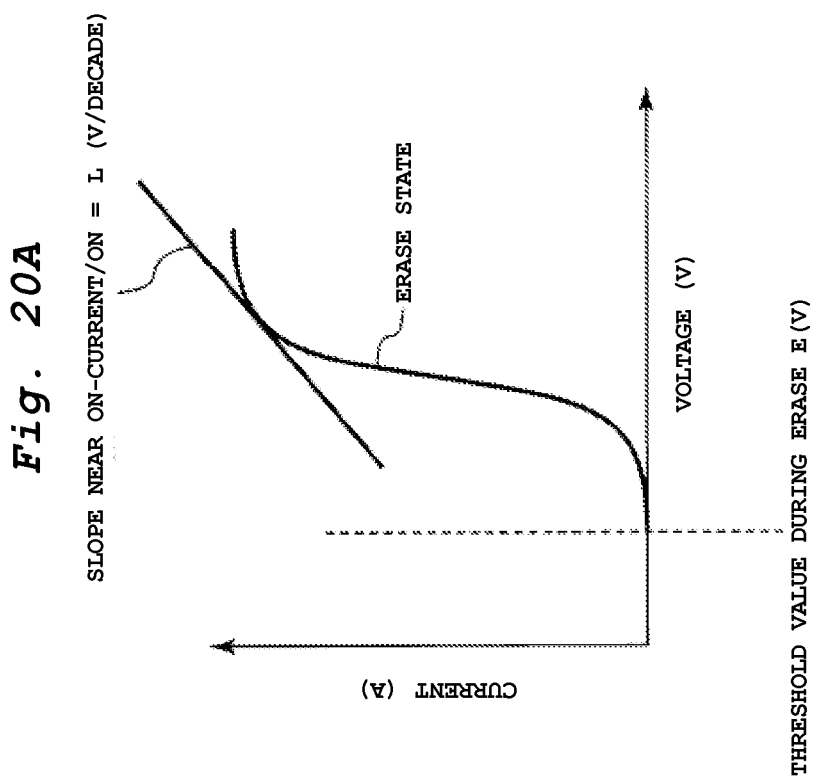

In addition, a memory transistor 19 may be used as the transistor of this additional circuit, as in the twenty-fifth and twenty-sixth embodiments shown in FIG. 19A and FIG. 19B. The same operation as that in the twenty-third and twenty-fourth embodiments shown in FIG. 18A and FIG. 18B can be carried out by applying a voltage that turns off the memory transistor 19 to the power source VP2 at the time of the DRAM operation, and applying the voltage at a high level to the power source VP1 in these twenty-third and twenty-fourth embodiments.

Furthermore, in the twenty-fifth and twenty-sixth embodiments, writing or erasing of the memory transistor 19 can also be carried out during the memory operation. This will be explained with reference to FIG. 20A and FIG. 20B. Assume that there is no change in the slope of the drain current in the memory transistor 19 with respect to the gate voltage. Also assume that the slope near the on-current $I_{on}$ (for example, 10 μA/μm) is L (V/decade). This slope is the gate voltage necessary for the drain current to increase by one order of magnitude. Assume that the threshold voltage at the time of erase is E (V). Writing is carried out so that the threshold value of the memory transistor 12a becomes E+2L (V), and the threshold value of the memory transistor 12b becomes sufficiently high. The writing is carried out by either forming the memory transistor 19 in the erase state, or setting the threshold voltage to E+4L (V) or greater. After that, reading is carried out by applying a read voltage 2L (V) to the word line WL and the power source VP2. At this time, a low level of potential is output to the node Q by, for example, forming the memory transistor 19 in the erase state, applying a high level of voltage to the bit line BL1 and a low level of voltage to the power source VP1, and applying 2L (V) to the word line WL and the power source VP2. When the memory transistor 19 is in the write status, on the contrary, a high level of potential is output to the node Q. With this method, the leakage current increases because the resistance ratio of the two memory transistors 12a and 19 is not significant. Accordingly, this is effective in controlling the memory transistors 12a and 19, other than the leakage current. Although this description pertains to the memory transistor 12a and the memory transistor 19, instead of the memory transistor 12a, the memory transistor 12b can also be used in the same manner.

Figure 21A:
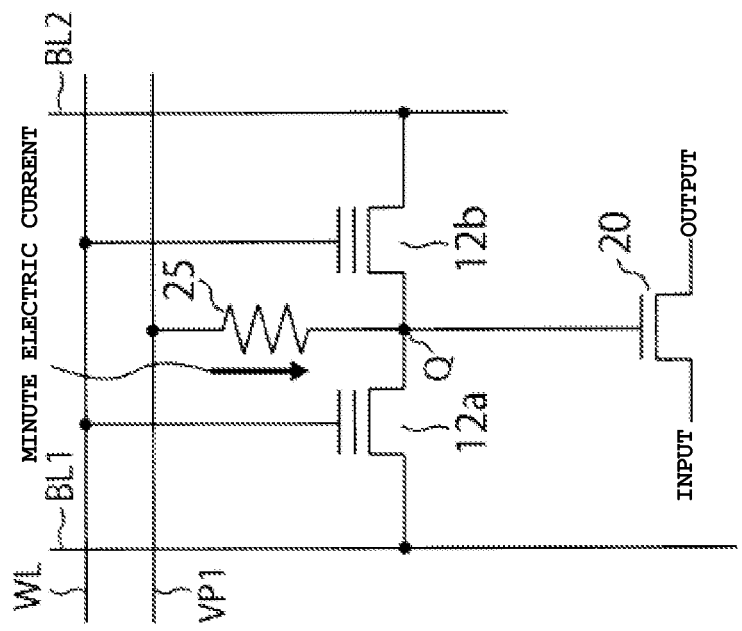
FIG. 21A and FIG. 21B are circuit diagrams illustrating memory cells of a memory according to a twenty-seventh and a twenty-eighth embodiments, respectively.
Figure 21B:
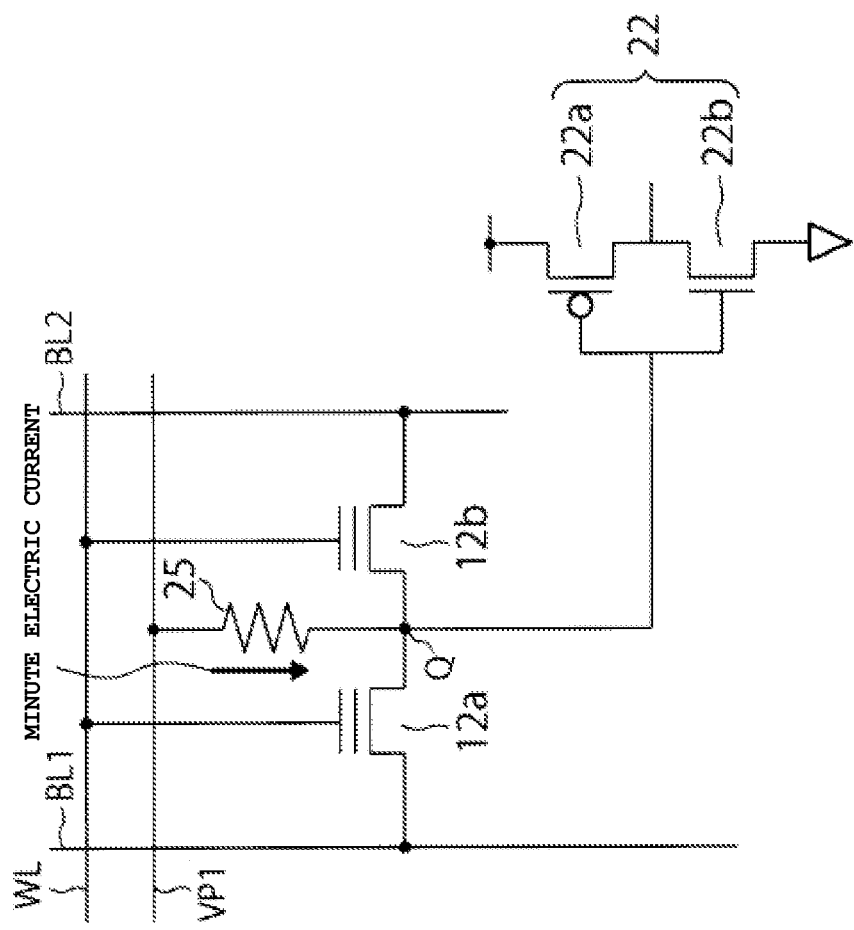

In addition, instead of the transistor 18 shown in FIG. 18A and FIG. 18B, a resistor 25 may also be used as the additional circuit, as in the twenty-seventh and twenty-eighth embodiments shown in FIG. 21A and FIG. 21B.

Figure 22B:
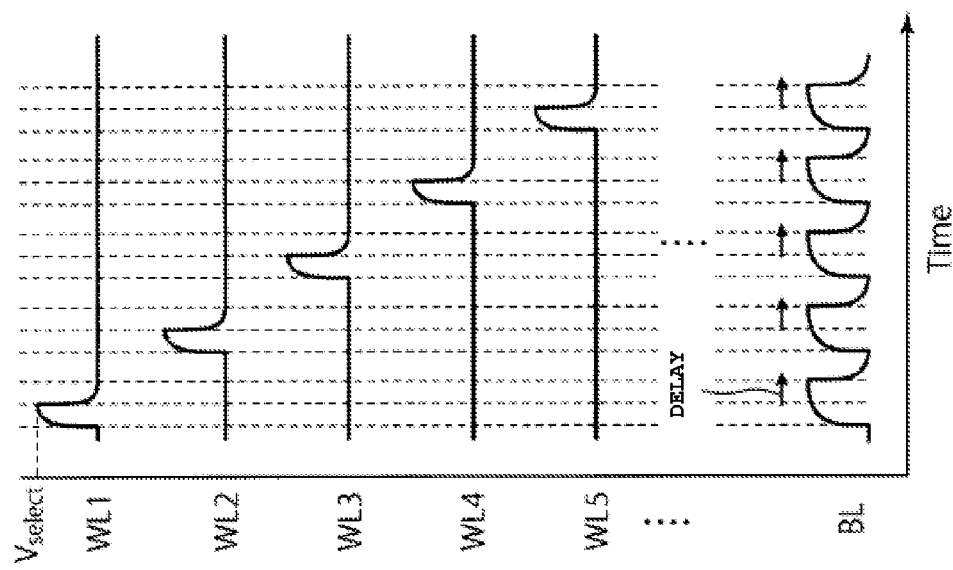

Next, the DRAM operation of the memory will be explained with reference to FIG. 22A and FIG. 22B. FIG. 22A shows a memory array and FIG. 22B shows a waveform diagram of the voltage applied to the word lines WL1-WL5 and the bit line BL. The switch circuit (e.g., pass transistor or inverter) of each memory cell will not be shown in FIG. 22A.

Assume that all memory cells are in the erase state. When accumulating the charge to the memory connected to the word line WL1, the select voltage $V_{select}$ is applied to the word line WL1, and the data is given to the bit line. At this time, all of the data are given to the bit lines BL1 to BL8 of the memory cells applied with the select voltage $V_{select}$ connected to the word line WL1. After that, the word line WL1 is made to be the off-voltage $V_{off}$. After the word line WL1 becomes the off-voltage $V_{off}$, the application of the select voltage $V_{select}$ to the word line WL2 and the application of data to the bit lines BL1 to BL8 are started. The important thing here is the fact that the data of the bit line is supplied during the application of the select voltage $V_{select}$ to the word line (for example, word line WL1) and, at that state, the word line WL1 is made to be the off-voltage $V_{off}$ so that the data can be retained by DRAM. The fact that the data of the bit line are supplied during the application of the select voltage $V_{select}$ to the word line WL1 refers to the voltage applied to the bit line being increased while the voltage applied to the word line WL1 is not decreased.

Figure 23A:
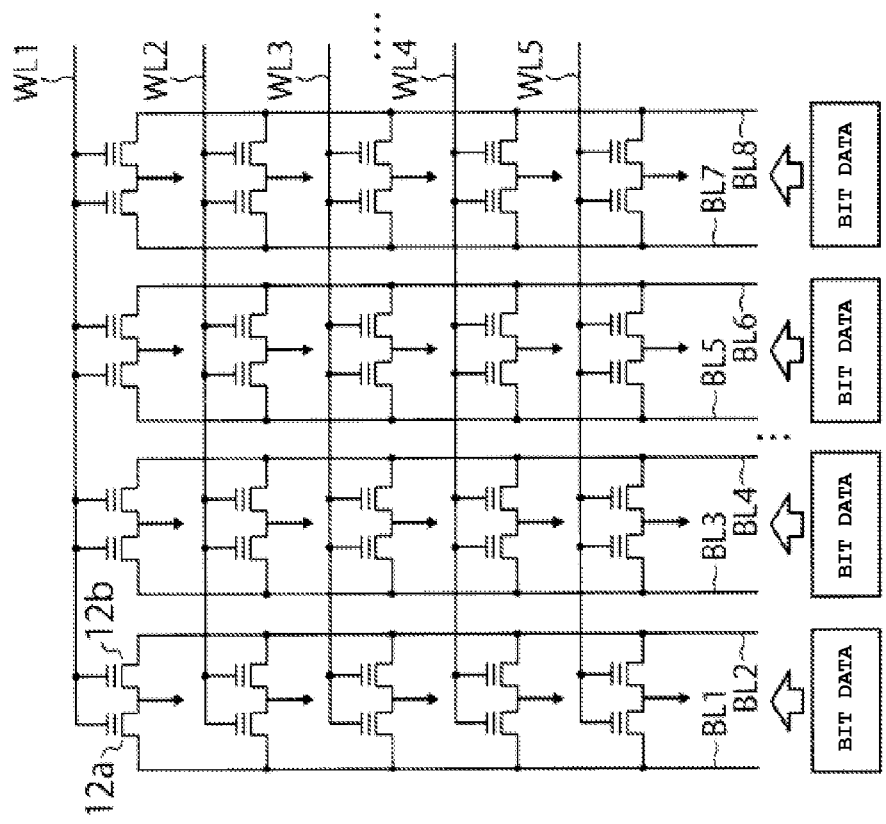
FIG. 23A and FIG. 23B depict a second example of the writing method.
Figure 23B:
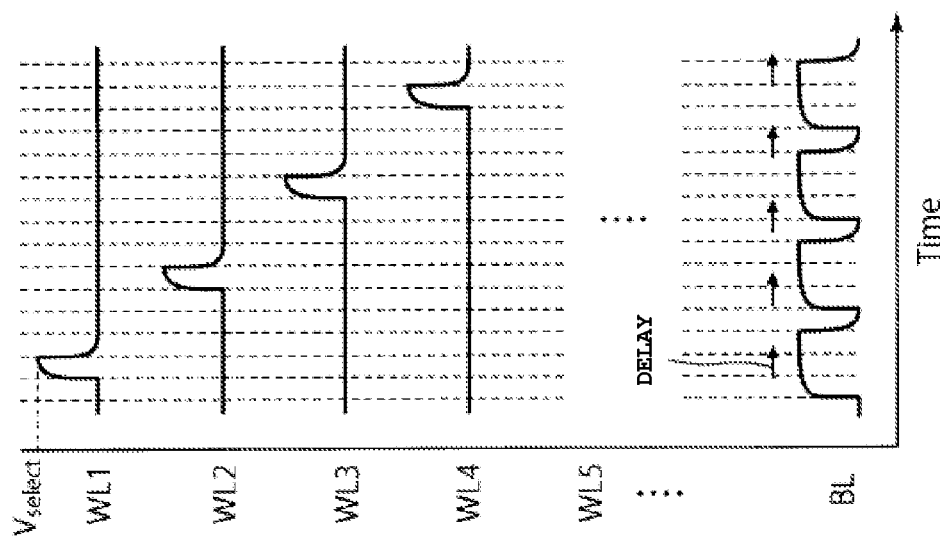
Figure 24A:
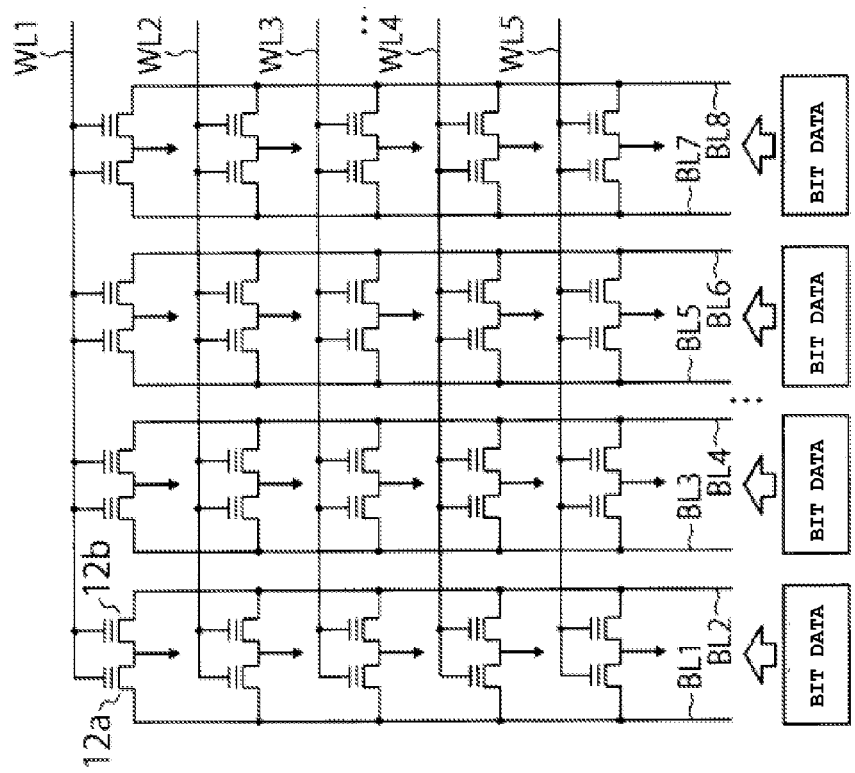
FIG. 24A and FIG. 24B depict a third example of the writing method.
Figure 24B:
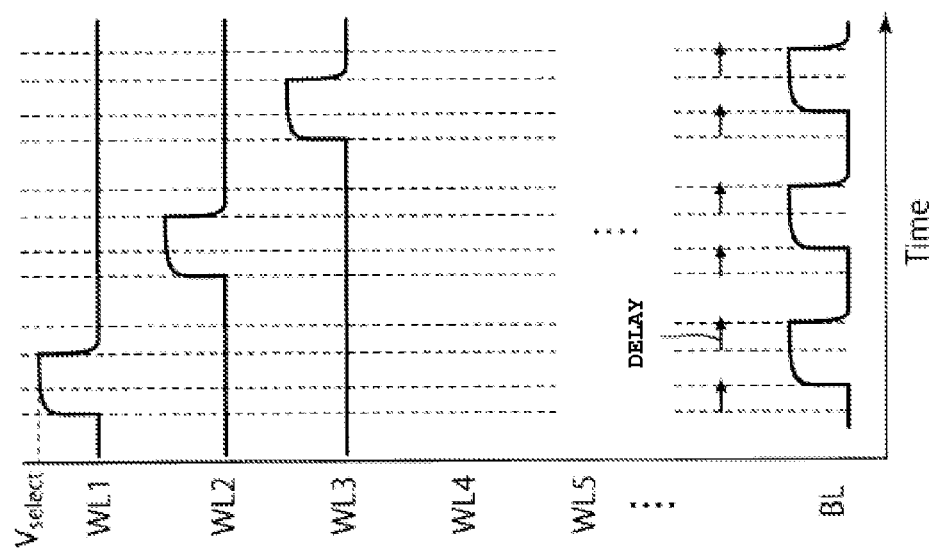

Accordingly, as shown in FIG. 23A and FIG. 23B, the word line may be made to be $V_{off} \rightarrow V_{select} \rightarrow V_{off}$ during the application of the data to the bit line. As shown in FIG. 24A and FIG. 24B, the DRAM operation is possible even when it is operated during the delay of the voltage to be applied to the word line and the bit line using the same signal waveform. In addition, the order of applying to the word line may be random or arbitrary.

Figure 25:
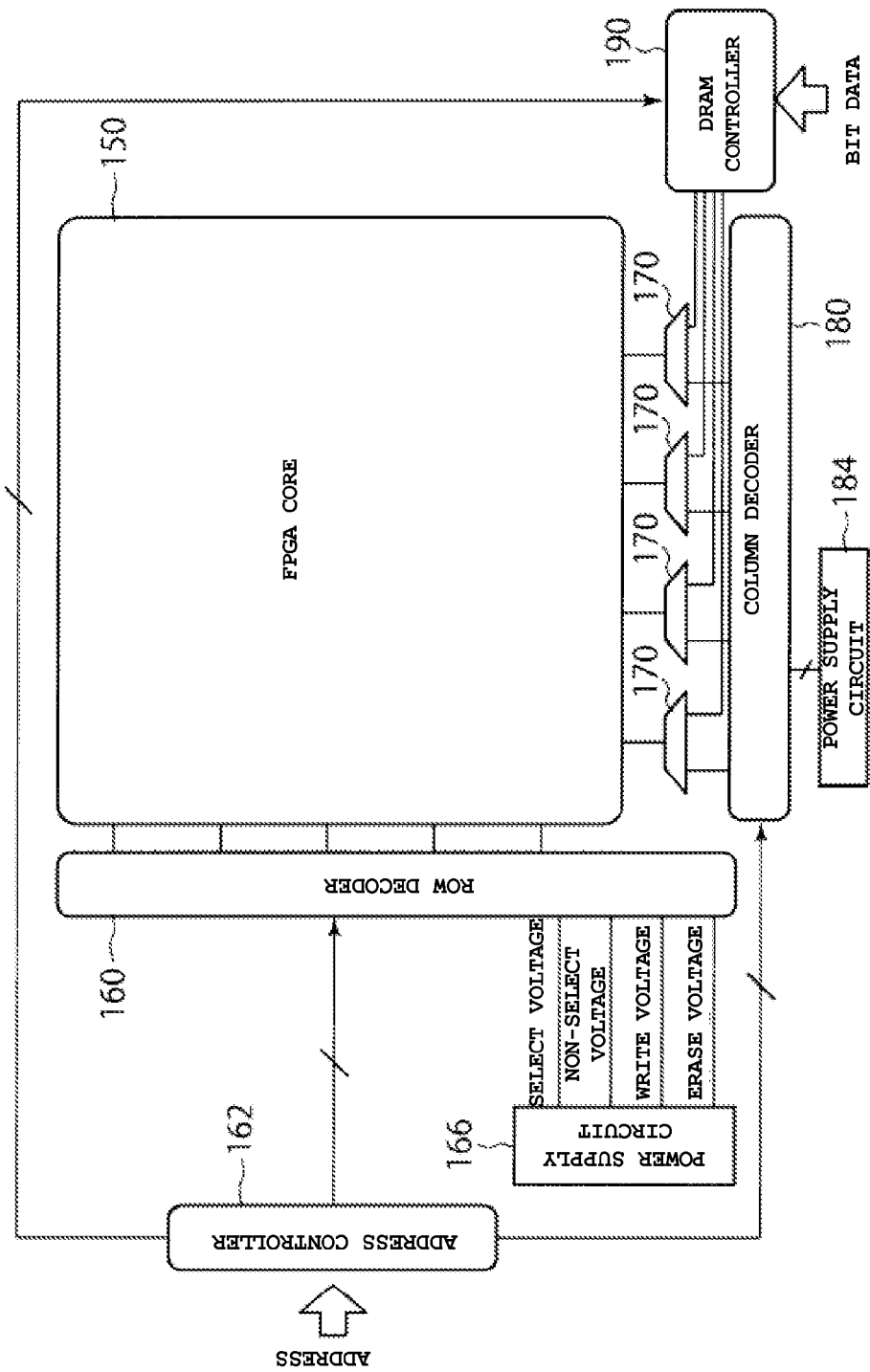
FIG. 25 is a block diagram illustrating a first example of FPGA according to an embodiment.

FIG. 25 shows the first example of FPGA according to one embodiment. The FPGA of this first example carries out a DRAM operation and memory operation afterward. The FPGA of the first example has a FPGA core 150, a row decoder 160, an address controller 162, a power source circuit 166, a plurality of multiplexers 170, a column decoder 180, a power source circuit 184, and a DRAM controller 190. The FPGA core 150 includes a plurality of basic tiles 102 that has been explained in FIGS. 1A to 1D, so it has a logic block LB and a switch block SB as shown in FIGS. 1A to 1D.

The row decoder 160 selects the word line of the memory included in the FPGA core 150 and applies the voltage, depending on the operating mode, to the selected word line, based on the address signals sent from the address controller 162. This voltage is supplied from the power source circuit 166. For example, at the time of the DRAM operation, the select voltage $V_{select}$ is applied to the selected word line and the non-select voltage $V_{off}$ (for example, 0 V) is applied to the non-selected word line. Furthermore, at the time of the writing operation, a write voltage (for example, 20V) is applied to the selected word line, and at the time of erase, the erase voltage (−20 V) is applied.

Based on the address signals sent from the address controller 162, the column decoder selects the bit line of the memory included in the FPGA core 150 and applies the voltage depending on the operating mode, to the selected bit line. This voltage is supplied from the power source circuit 184. For example, at the time of the writing operation, a write voltage (for example, 0 V) is applied, and the non-select voltage (for example, 8 V) is applied to the non-selected bit line.

In addition, in this first example, at the time of the DRAM operation, the multiplexer 170 selects the signals from the DRAM controller 190 instead of the column decoder 180. This DRAM controller 190 controls the bit data for the DRAM operation.

Figure 26:
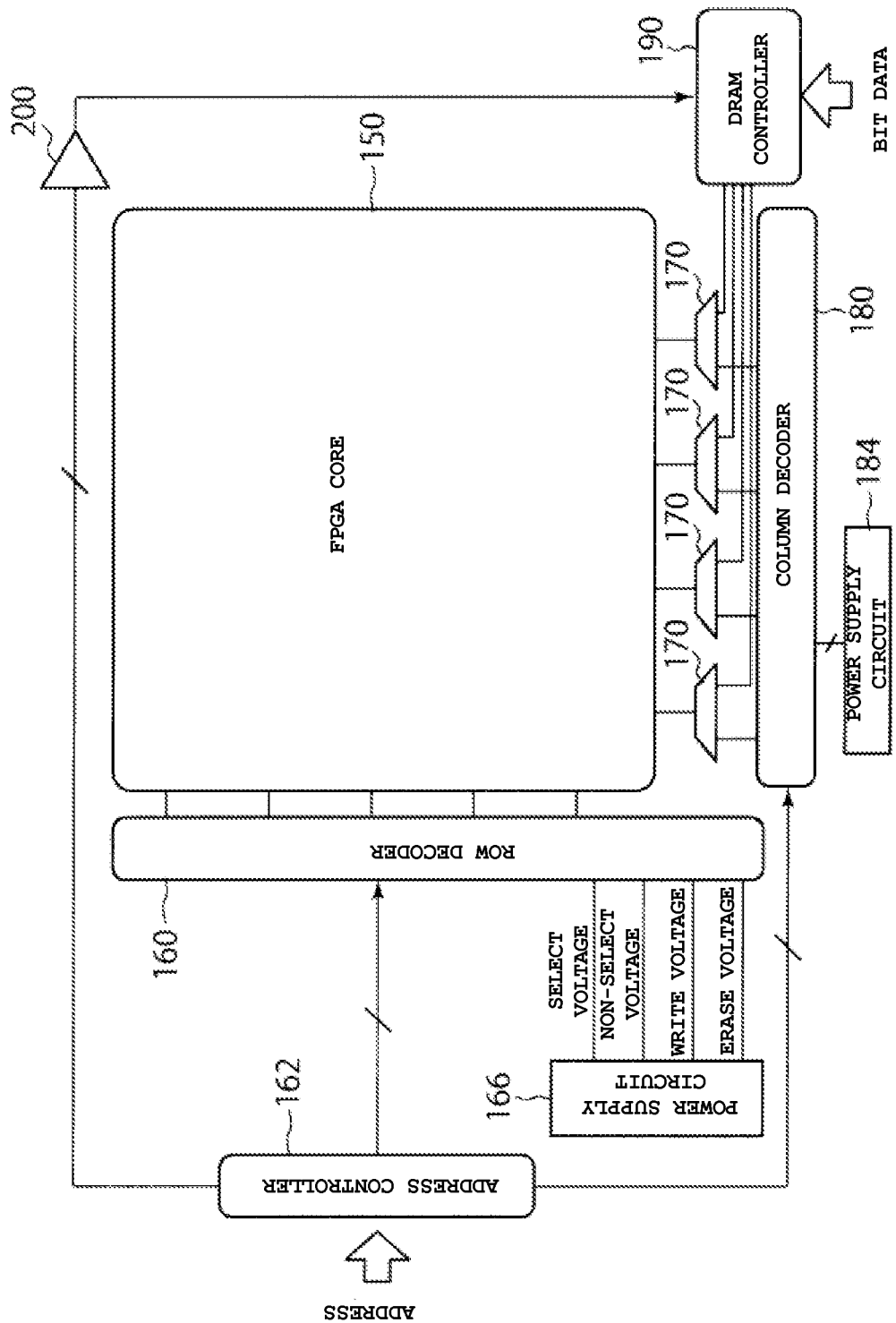
FIG. 26 is a block diagram illustrating a second example of FPGA according to an embodiment.

FIG. 26 shows the second example of FPGA according to one embodiment. This FPGA of the second example has a configuration in which a delay element 200 is provided between the address controller 162 and the DRAM controller 190 in the FPGA of the first example. By using this configuration, not only is the operation shown in FIG. 24B possible, but the input signal can also be used as is, so the circuit configuration of the DRAM controller 190 can be made simpler.

Figure 27:
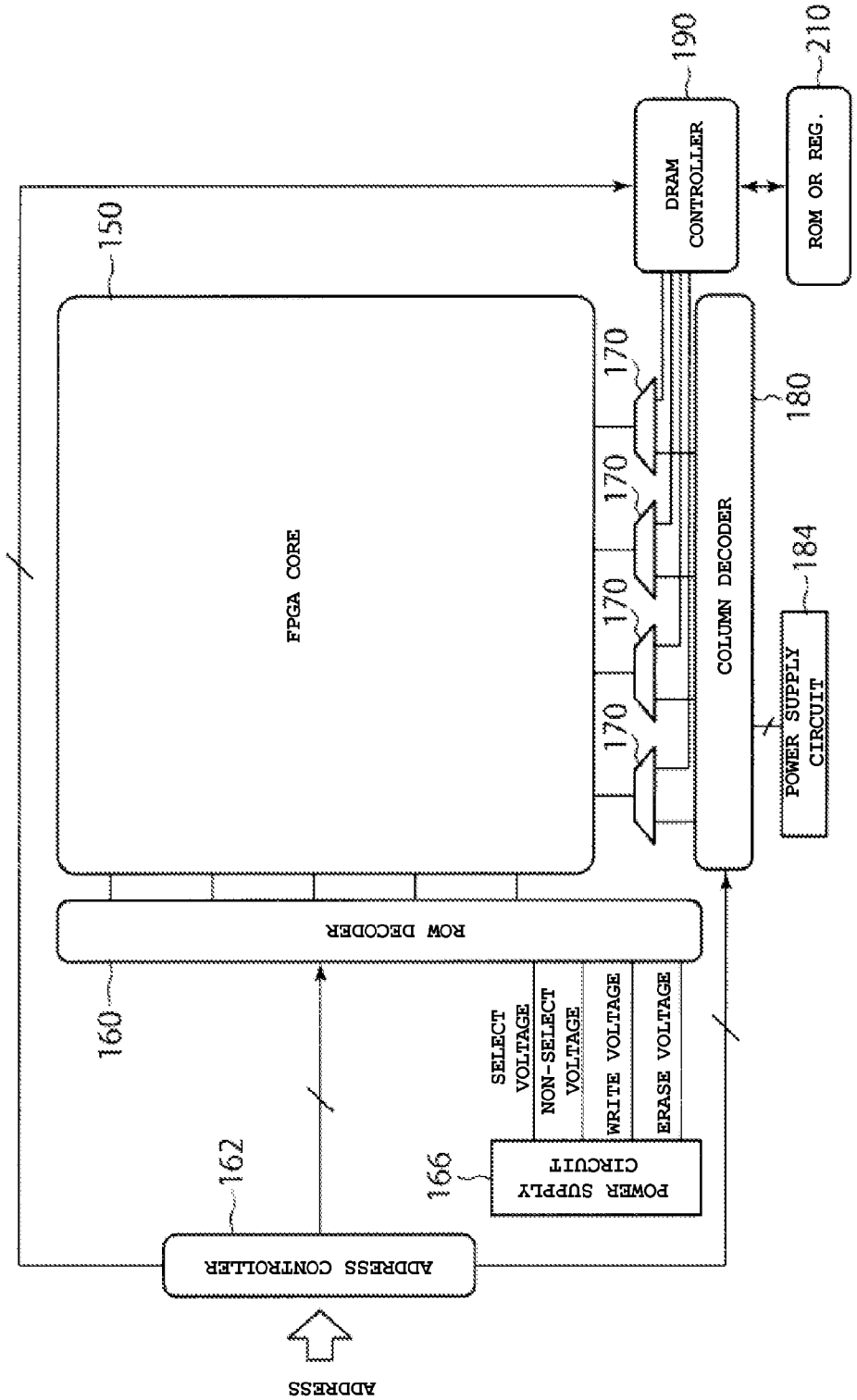
FIG. 27 is a block diagram illustrating a third example of FPGA according to an embodiment.

FIG. 27 shows the third example of FPGA according to one embodiment. The FPGA of this third example has a configuration that has an internal memory 210 including a register or a ROM for storing the bit data supplied to the DRAM controller 190, in the FPGA of the first example. By using this configuration, the bit data can be input at a high speed in the DRAM operation. Furthermore, the memory that shares word lines must deliver the bit data at the same time, so the pin (connection) for the portion of the bit data is required in order to input the data using the pin from the outside, which is not practical. On the other hand, there is no concern for the data disappearing once the memory transistor carries out the writing or the erasing, so the data can be transferred serially using the external pin. In this way, the DRAM operation and the memory operation can be carried out by having both the internal memory 210 or controllers 162 and 190 for the DRAM operation, along with the column decoder 180 for memory writing. Also, ROM (Read Only Memory) or a register can be used as the internal memory 210. In addition, the data inside ROM may be compressed; in such a case, the data are supplied after being decompressed at the DRAM controller 190.

Figure 28:
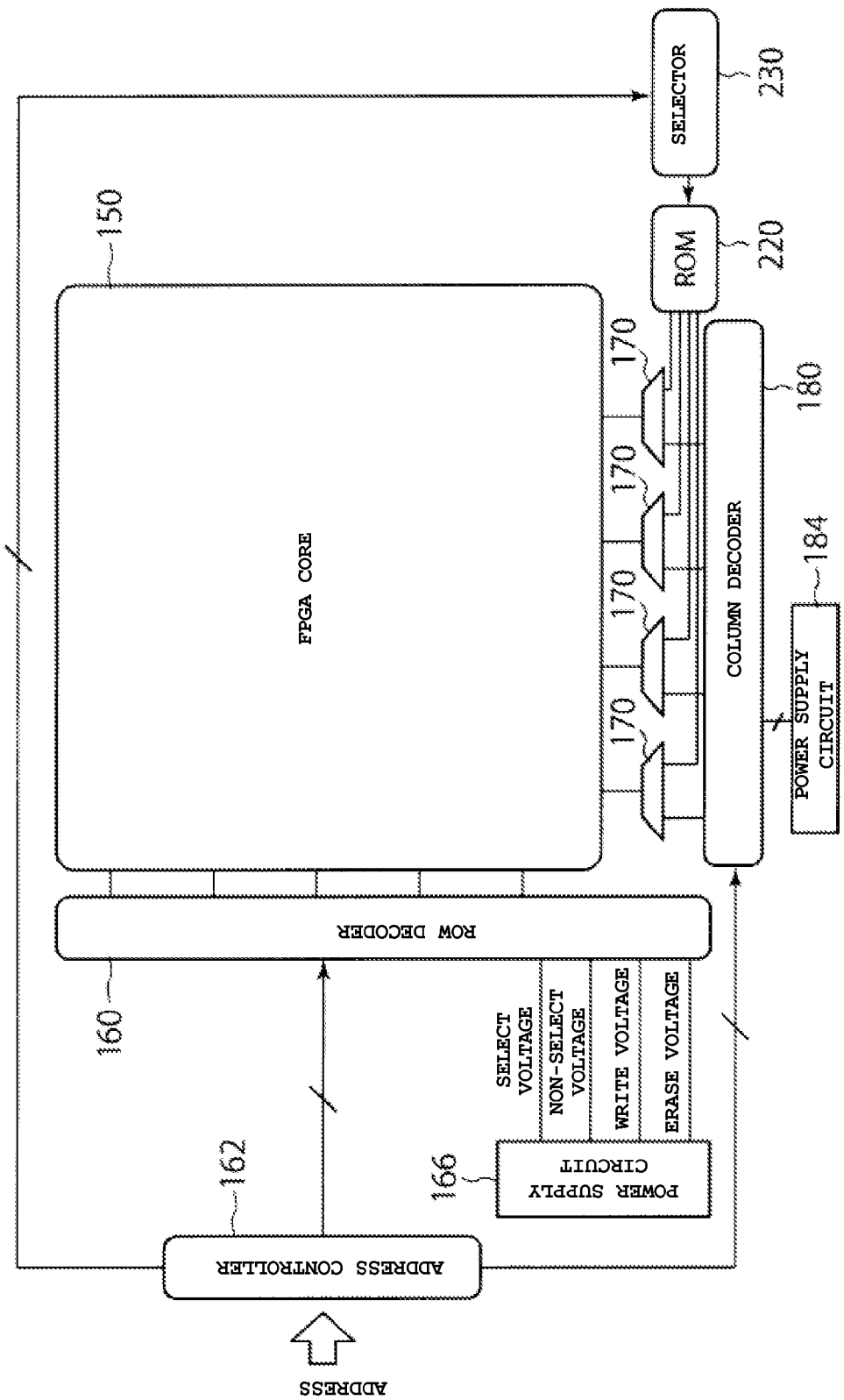
FIG. 28 is a block diagram illustrating a fourth example of FPGA according to an embodiment.
Figure 29:
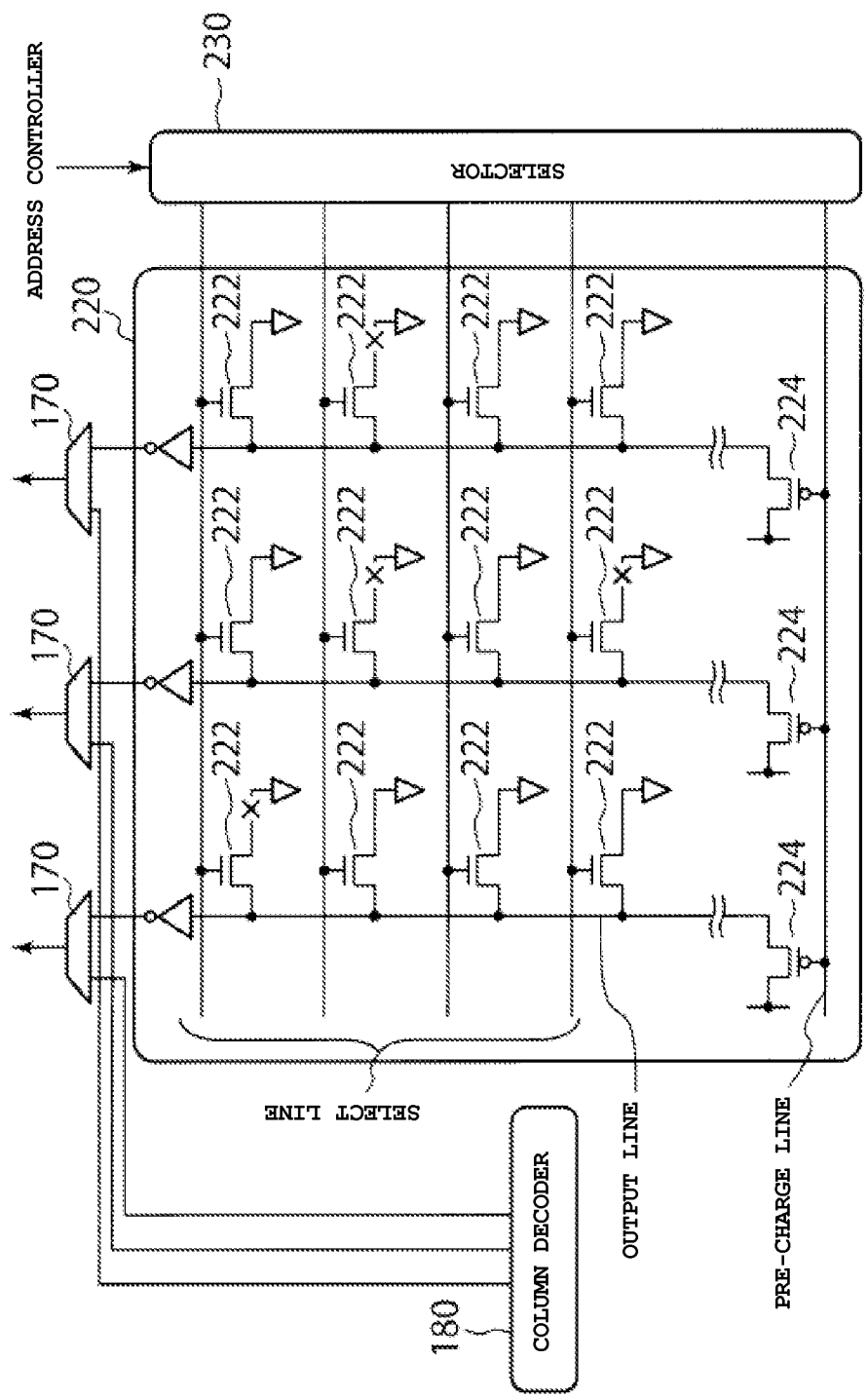
FIG. 29 is a circuit diagram illustrating an example of ROM used in the fourth example.

FIG. 28 shows the fourth example of FPGA according to one embodiment. The FPGA of this fourth example has a configuration that has a ROM 220 and a selector 230 provided, in place of the DRAM controller 190 in the FPGA of the first example. FIG. 29 shows one example of the ROM 220 used in this fourth example. This ROM 220 stores data of "0" or "1" depending on whether one end of the source and the drain of the transistor 222 connected in an array form is connected to the ground potential. The selector 230 operates a pMOS transistor 224 in advance, and pre-charges the output line. After that, the selector 230 selects the select line; if the selected transistor 222 is connected to the ground potential, the charge will be withdrawn from the output line and a high level will be output. If the selected transistor 222 is not connected to the ground potential, the potential will be output at a low level. The ROM 220 can only be used when the data have been determined in advance; however, it has the merit of being able to be fabricated in a small area because 1 bit can be realized by one transistor. For example, there is merit in the ROM having a small area so it can be retained internally because the test of the logic operation has its pattern determined in advance. The ROM 220 may be classified as several types. In addition, for example, at the test of the logic operation, there might be a time when the same data are necessary for several memories of the same word line in the reconfigurable integrated circuit device in which the blocks are periodically arranged. Accordingly, the data may be transferred to several memories from one ROM 220.

Figure 30:
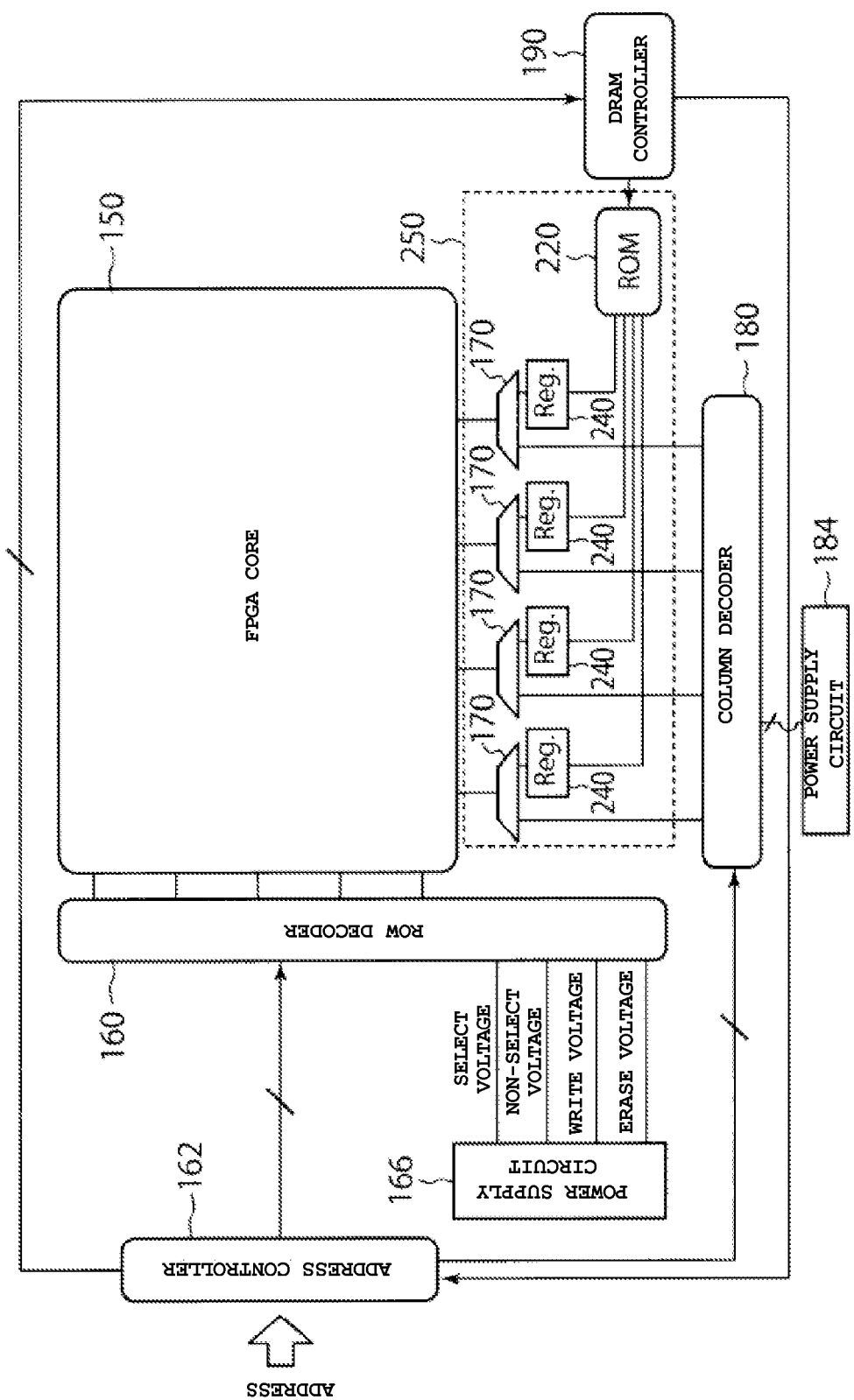
FIG. 30 is a block diagram illustrating a fifth example of FPGA according to an embodiment.

FIG. 30 shows the fifth example of FPGA according to one embodiment. The FPGA of this fifth example has a configuration in which a ROM 220 and a register 240 are provided between the DRAM controller 190 and the multiplexer 170. By this configuration, the bit data can be applied in a stable manner. The block 250 including the ROM 220, the register 240, and the multiplexer 170 may be divided into several pieces rather than forming a single unit or module as depicted.

Figure 31:
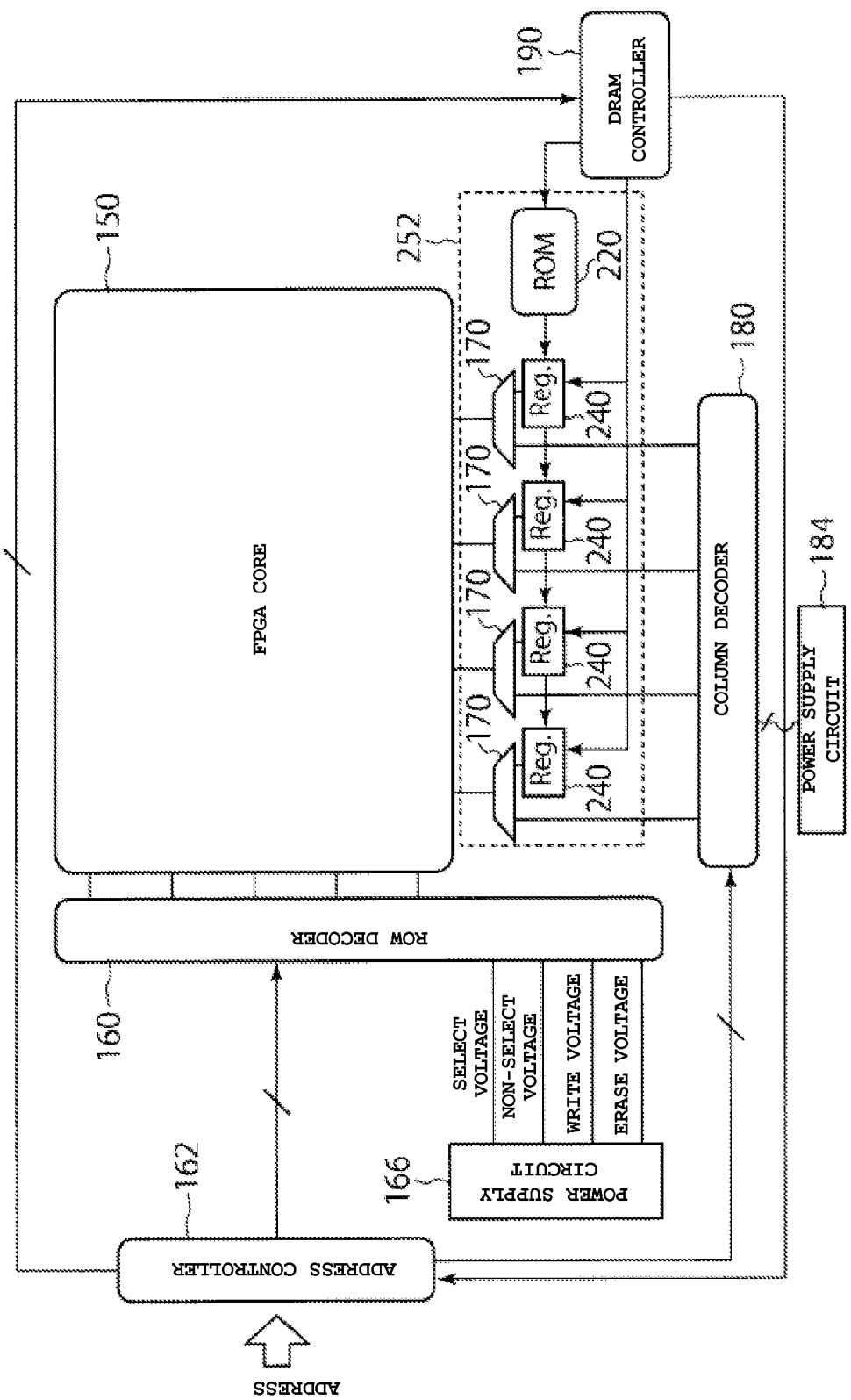
FIG. 31 is a block diagram illustrating a sixth example of FPGA according to an embodiment.
Figure 32:
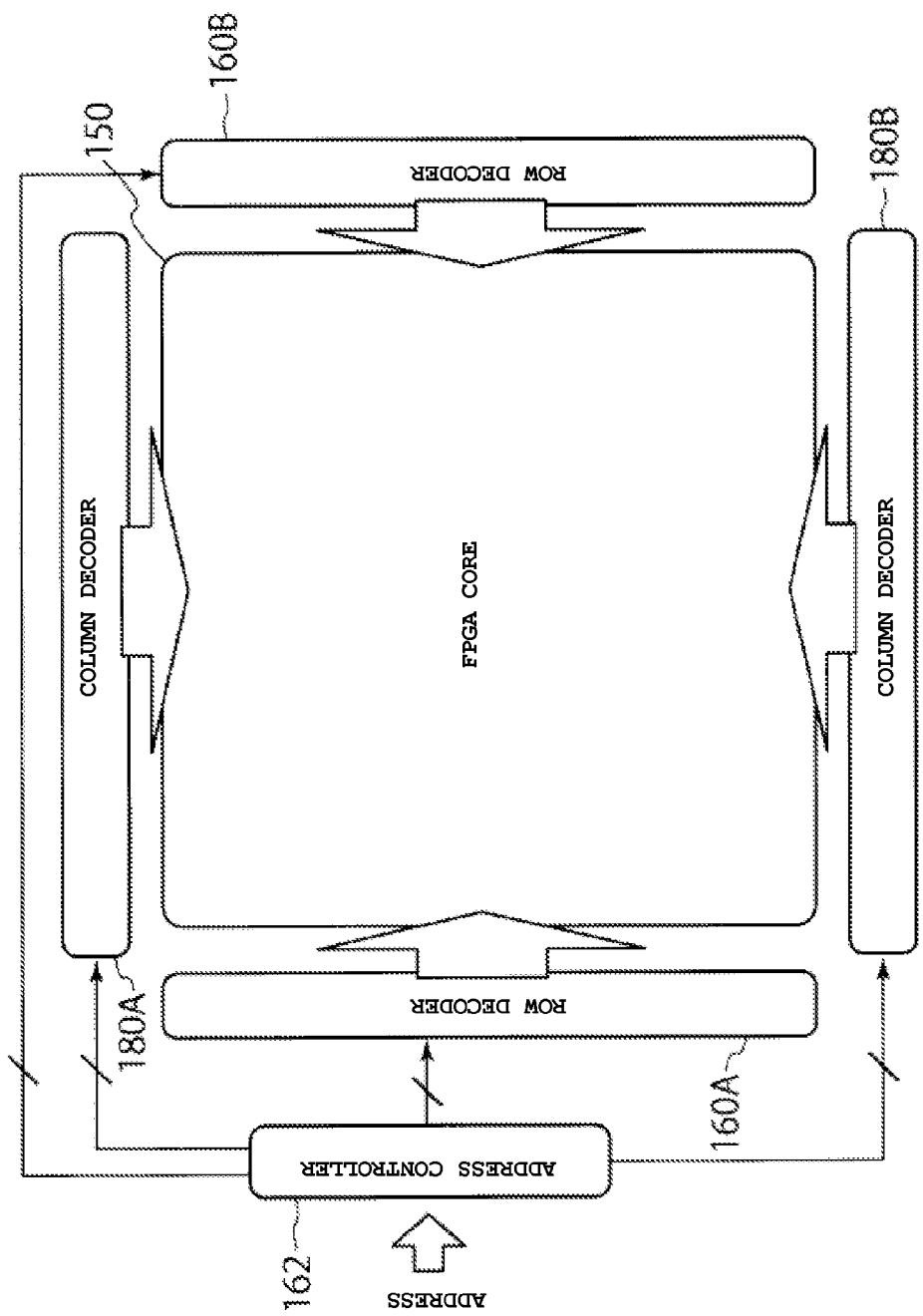
FIG. 32 is a block diagram illustrating a seventh example of FPGA according to an embodiment.

FIG. 31 shows the sixth example of FPGA according to one embodiment. The FPGA of the fifth example shown in FIG. 30 sends the data from the ROM 220 to each register. The FPGA of this sixth example has a configuration in which the block 250 is replaced with the block 252 in the FPGA of the fifth example. This block 252 is one in which the register 240 serves as the shift register, the data from the ROM 220 are sent at the input stage of the shift register 240, and the data are retained by the shift register 240. In this way, the amount of data read once from the ROM 220 can be reduced. At which stage the shift register is configured depends on the transfer speed of the shift register and the retention time of the charge at the time of the DRAM operation. Similar to those that have been described before, the block 252 containing the ROM 220, the register 240, and the multiplexer 170 may be divided into several blocks.

In each example, the location or the quantity of the row decoder and the column decoder is not limited. For example, as in the seventh example shown in FIG. 32, two column decoders 180A and 180B may be arranged above and below the FPGA core 150, and two row decoders 160A and 160B may be arranged to the left and right. In this seventh example, the power source circuit 166 and the power source circuit 184 as described in the first example are included but they are not shown in the drawing.

Figure 33:
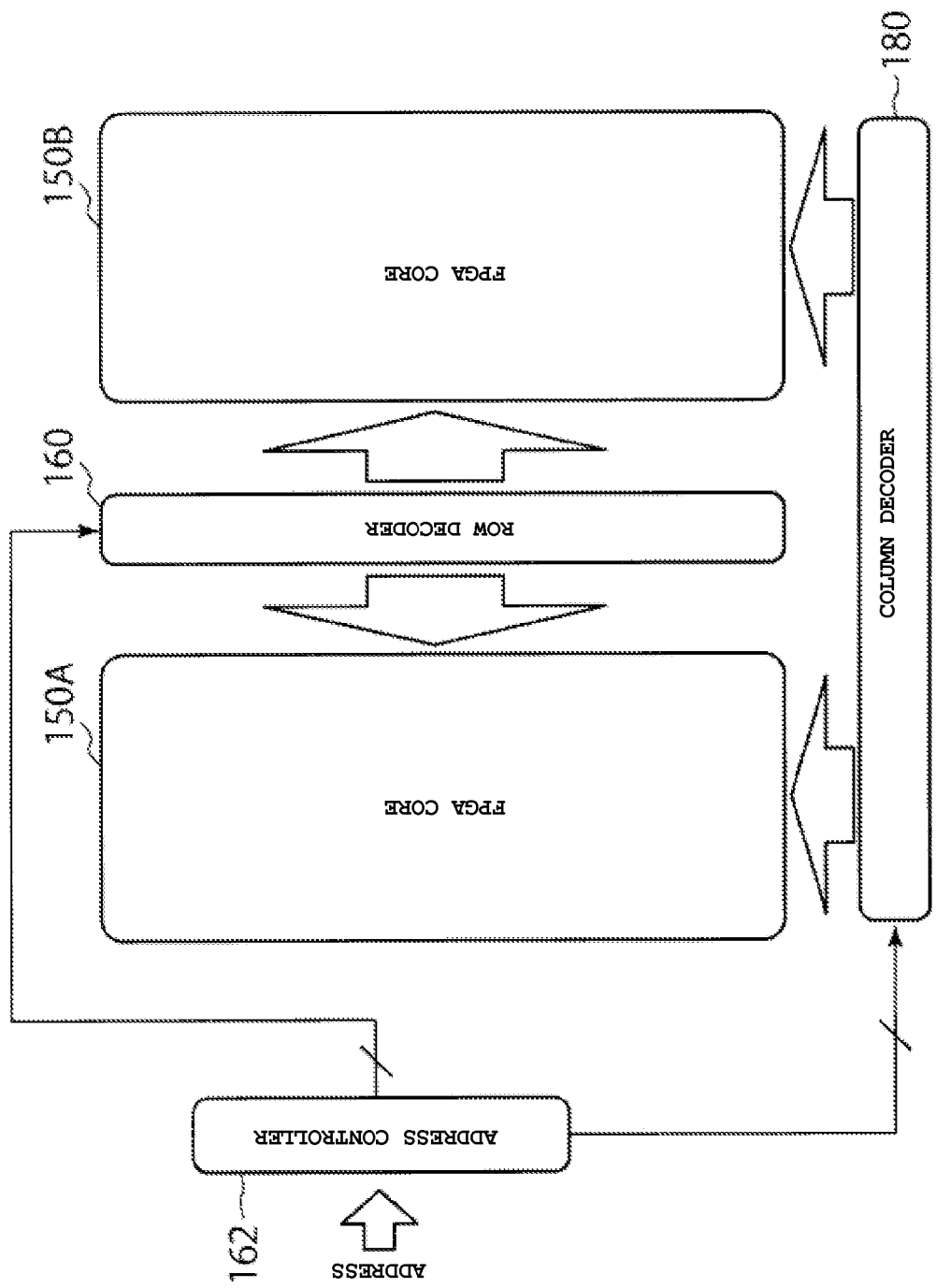
FIG. 33 is a block diagram illustrating an eighth example of FPGA according to an embodiment.

In addition, as in the eighth example shown in FIG. 33, the FPGA core may be split into two FPGA cores 150A and 150B. In this eighth example, the power source circuit 166 and the power source circuit 184 as described in the first example are included, but they are not shown in the drawing.

Figure 34:
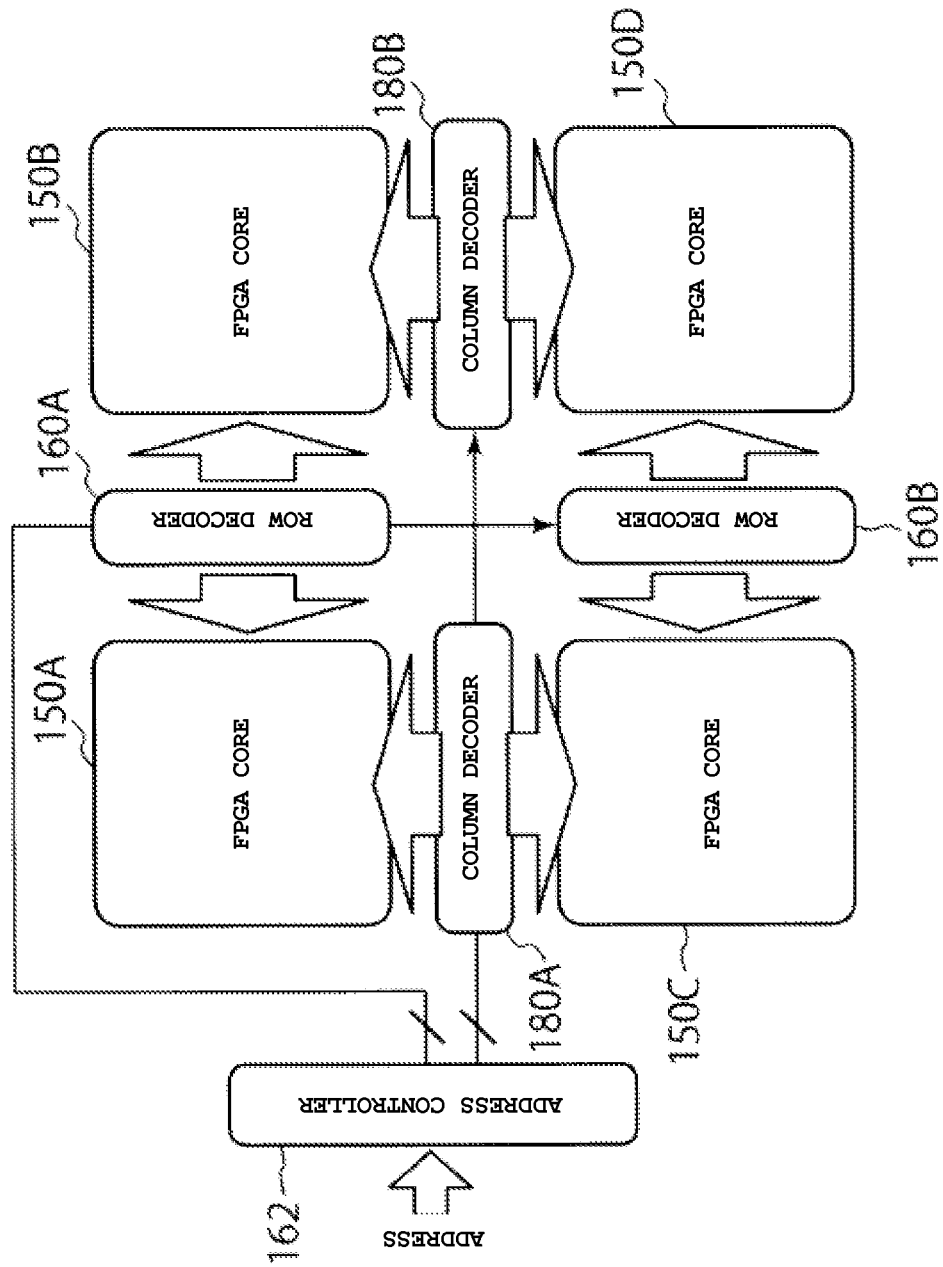
FIG. 34 is a block diagram illustrating a ninth example of FPGA according to an embodiment.

As in the ninth example shown in FIG. 34, with respect to the FPGA cores 150A, 150B, 150C, and 150D that had been split into four cores, a row decoder 160A may be provided between FPGA 150A and FPGA 150B, a row decoder 160B between FPGA 150C and FPGA 150D, a column decoder 180A between FPGA 150A and FPGA 150C, and a column decoder 180B between FPGA 150B and FPGA 150D. In this ninth example, the power source circuit 166 and the power source circuit 184 as described in the first example are included, but they are not shown in the drawing.

By adopting the configuration as described in the seventh to ninth examples, the wiring charged by one decoder becomes short, enabling it to apply voltage at a higher speed.

As has been explained above, according to the present embodiments, it is possible to provide a reconfigurable integrated circuit device having a memory capable of repeat writing and high speed writing with less current consumption and less footprint, as well as to provide a writing method thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reconfigurable integrated circuit device comprising:
   a memory unit for storing configuration information, the memory unit including:
      a first nonvolatile memory transistor having a gate connected to a first wire, a first terminal connected to a second wire, and a second terminal connected to a third wire:
      a switch circuit connected to the third wire; and
      a capacitor connected to the third wire;
   a data supply circuit configured to supply bit data to the second wire; and
   a power supply circuit configured to supply a write voltage to the first wire as a result of which the bit data is stored in the first nonvolatile memory transistor as a charge level and to supply a select voltage and then a non-select voltage to the first wire as a result of which the bit data is stored in the third wire as a charge level.

2. A reconfigurable integrated circuit device comprising:
   a memory unit for storing configuration information, the memory unit including:
      a first nonvolatile memory transistor having a gate connected to a first wire, a first terminal connected to a second wire, and a second terminal connected to a third wire,
      a second nonvolatile memory transistor having a gate connected to the first wire, a first terminal connected to third wire, and a second terminal connected to a fourth wire; and
   a switch circuit connected to the third wire;
   a data supply circuit configured to supply bit data to the second and/or fourth wire; and
   a power supply circuit configured to supply a write voltage to the first wire as a result of which the bit data is stored in the first or second nonvolatile memory transistor as a charge level and to supply a select voltage and then a non-select voltage to the first wire for storing bit data as the charge level on the third wire.

3. The reconfigurable integrated circuit device of claim 2, the memory unit further comprising:
   an additional circuit component connected to the third wire for maintaining a charge level on the third wire.

4. The reconfigurable integrated circuit device of claim 3, wherein the additional circuit component is a capacitor.

5. The reconfigurable integrated circuit device of claim 3, wherein the additional circuit component is a transistor having a gate connected to the third wire, a source terminal connected to a first power supply voltage, and a drain terminal connected to a second power supply voltage.

6. The reconfigurable integrated circuit device of claim 5, wherein the first power supply voltage and the second power supply voltage are the same.

7. The reconfigurable integrated circuit device of claim 3, wherein the additional circuit component is a diode-connected transistor.

8. The reconfigurable integrated circuit device of claim 3, wherein the additional circuit component is a diode having a cathode connected to a first power supply voltage and an anode connected to the third wire.

9. The reconfigurable integrated circuit device of claim 3, wherein the additional circuit component is a transistor having a first terminal connected to a first power supply voltage, second terminal connected to the third wire, and a gate connected to a second power supply voltage.

10. The reconfigurable integrated circuit device of claim 9, wherein the transistor is a memory transistor.

11. The reconfigurable integrated circuit device of claim 3, wherein the additional circuit component is a resistor with a first end connected to a first power supply voltage and a second end connected to the third wire.

12. The reconfigurable integrated circuit device of claim 1, wherein the switch circuit is a pass transistor with a gate connected to the third wire.

13. The reconfigurable integrated circuit device of claim 1, wherein the switch circuit includes an inverter circuit comprising:
   a p-channel transistor with a gate connected to the third wire and a source connected to a first power source voltage; and
   an n-channel transistor with a gate connected to the third wire, a source connected to a second power source voltage, and a drain connected to the drain of the p-channel transistor.

14. A reconfigurable integrated circuit device of claim 1, wherein the data supply circuit includes:
   a dynamic random access memory (DRAM) controller; and
   a read-only memory unit.

15. A field programmable gate array device comprising:
   a field programmable gate array core including at least one memory unit comprising:
      a first nonvolatile memory transistor having a gate connected to a first wire, a first terminal connected to a second wire, and a second terminal connected to a third wire;
      a second nonvolatile memory transistor having a gate connected to the first wire, a first terminal connected to the third wire, and a second terminal connected to a fourth wire; and
      a switch circuit connected to the third wire;
   a data supply circuit configured to supply bit data to the second and/or fourth wire, the data supply circuit including a dynamic random access memory (DRAM) controller and a column decoder; and
   a power supply circuit configured to supply a write voltage to the first wire as a result of which the bit data is stored in the first or second nonvolatile memory transistor as a charge level and to supply a select voltage and then a non-select voltage to the first wire for storing bit data as the charge level on the third wire.

16. A method of writing configuration information to a reconfigurable integrated circuit device that includes a plurality of memory units each unit of which including a first nonvolatile memory transistor having a gate connected to a first wire, a first terminal connected to a second wire, and a second terminal connected to a third wire, and a switch circuit connected to the third wire, the writing method comprising:
   selecting a memory unit from the plurality of memory units;
   applying a select voltage to the first wire of the selected memory unit, the select voltage sufficient to place the first non-volatile memory transistor in a conductive state;
   storing a first charge on the third wire by applying a bit data voltage to second wire of the selected memory unit when the select voltage is being applied to the first wire, the bit data voltage corresponding to a configuration setting to be stored in the memory unit;
   applying a non-select voltage to the first wire while the bit data voltage is being applied to the second wire of the selected memory unit, the non-select voltage placing the first non-volatile memory transistor in a non-conductive state; and
   storing a second charge on a charge accumulation layer of the first non-volatile memory transistor, the second charge corresponding to the configuration setting to be stored in the memory unit.

17. The method of claim 16, wherein data is stored in the first non-volatile memory transistor of the selected memory unit using a tunneling current.

18. The reconfigurable integrated circuit device of claim 2, wherein the switch circuit is a pass transistor with a gate connected to the third wire.

19. The reconfigurable integrated circuit device of claim 2, wherein the switch circuit is an inverter circuit that includes:
   a p-channel transistor with a gate connected to the third wire and a source connected to a first power source voltage; and
   an n-channel transistor with a gate connected to the third wire, a source connected to a second power source voltage, and a drain connected to the drain of the p-channel transistor.

20. A reconfigurable integrated circuit device of claim 2, wherein the data supply circuit includes:
   a dynamic random access memory (DRAM) controller; and
   a read-only memory unit.

* * * * *